(12) United States Patent
Endo

(10) Patent No.: US 7,056,839 B2
(45) Date of Patent: Jun. 6, 2006

(54) METHOD OF FORMING A SILICA INSULATION FILM WITH A REDUCED DIELECTRIC CONSTANT

(75) Inventor: Kazuhiko Endo, Tokyo (JP)

(73) Assignee: NEC Corporation, Tokyo (JP)

(*) Notice: Subject to any disclaimer, the term of this patent is extended or adjusted under 35 U.S.C. 154(b) by 522 days.

(21) Appl. No.: 10/017,396

(22) Filed: Dec. 18, 2001

(65) Prior Publication Data

US 2002/0086109 A1 Jul. 4, 2002

Related U.S. Application Data

(62) Division of application No. 09/093,193, filed on Jun. 8, 1998, now abandoned.

(30) Foreign Application Priority Data

Jun. 9, 1997 (JP) .............................. 9-150762

(51) Int. Cl.
H01L 21/31 (2006.01)

(52) U.S. Cl. ................. 438/781; 438/780; 438/790; 438/638

(58) Field of Classification Search ............ 438/780, 438/781, 789, 709, 790, 637; 437/235–238; 528/26; 427/255; 257/632, 641, 760, 758
See application file for complete search history.

(56) References Cited

U.S. PATENT DOCUMENTS

| 1,353,622 | A | | 9/1920 | Asenhurst |
| 1,842,083 | A | | 8/1929 | Elias |
| 1,919,372 | A | | 7/1933 | Kliefoth |
| 4,923,948 | A | * | 5/1990 | Matsuki et al. ............... 528/26 |
| 4,981,724 | A | * | 1/1991 | Hochberg et al. ...... 427/255.37 |
| 4,983,419 | A | | 1/1991 | Henkel et al. |
| 5,057,336 | A | | 10/1991 | Adachi et al. |
| 5,089,303 | A | | 2/1992 | Deatcher et al. |
| 5,494,858 | A | | 2/1996 | Gnade et al. |
| 5,554,570 | A | * | 9/1996 | Maeda et al. ............... 438/763 |
| 5,624,875 | A | * | 4/1997 | Nakanishi et al. ............ 501/39 |

FOREIGN PATENT DOCUMENTS

| EP | 0 387 403 | 9/1990 |
| EP | 0 611 733 | 8/1994 |
| EP | 0 713 927 | 5/1996 |
| GB | 2 292 751 | 3/1996 |
| JP | 6-80879 | 3/1994 |
| JP | 9-55425 | 2/1997 |
| JP | 9-251997 | 9/1997 |
| JP | 9-298241 | 11/1997 |
| JP | 10-125674 | 5/1998 |
| JP | 10-335324 | 12/1998 |
| KR | 91-10537 | 6/1991 |
| KR | 92-7795 | 5/1992 |

\* cited by examiner

*Primary Examiner*—Carl Whitehead, Jr.
*Assistant Examiner*—Yennhu B. Huynh
(74) *Attorney, Agent, or Firm*—Young & Thompson

(57) ABSTRACT

The invention provides an insulator having a main component of silicon dioxide, wherein the insulator includes at least one kind of organic polymer such as benzene nucleuses distributed therein in order to reduce a dielectric constant thereof as well as a method of forming the same.

16 Claims, 18 Drawing Sheets

METHOD OF FORMING A SILICA INSULATION FILM WITH A REDUCED DIELECTRIC CONSTANT

This application is a division of application Ser. No. 09/093,193, filed on Jun. 8, 1998, abandoned the entire contents of which are hereby incorporated by reference.

BACKGROUND OF THE INVENTION

The present invention relates to a silica insulation film with a reduced dielectric constant and a method of forming the same, as well as relates to a silica inter-layer insulator with a reduced dielectric constant between multi-level interconnections in a semiconductor device and a method of forming the same, in addition relates to a semiconductor device with a multi-level interconnection structure having a silica inter-layer insulator with a reduced dielectric constant and a method of fabricating the same.

With an increase in density of integration of ultra large scale integrated circuit, the feature size of integrated semiconductor devices has been reduced to submicron order and also multi-level interconnection techniques become more important. In order to electrically isolate the different level interconnections, an inter-layer insulator is provided between the different level interconnections. The inter-layer insulator is required to possess a high stability at high temperature and a high electrical insulation property, in addition a good gap filling property. In prior art, a silica film or a silicon dioxide film, a silicon nitride film and a phospho-silicate glass film were, for example, used as inter-layer insulators between different level interconnections. Those inter-layer insulators were usually formed by various chemical vapor deposition methods.

In recent years, requirement for a further shrinkage of the feature size of integrated semiconductor devices has been on the increase in accordance with design rules of advanced large scale integrated circuits. The further shrinkage of the feature size of integrated semiconductor devices has raised a serious problem with delay in signal transmission on interconnections due to a parasitic capacitance between the interconnections rather than signal delay of individual devices integrated. The improvement in high speed performance of the large scale integrated circuit would be limited by the problem with delay in signal transmission on interconnections due to a parasitic capacitance between the interconnections even if a considerable shrinkage of the feature size of integrated semiconductor devices could be realized.

In order to realize a further improvement in high speed performance of the large scale integrated circuit, it is important to reduce the parasitic capacitance between the interconnections as many as possible. Since the parasitic capacitance between the interconnections depends upon a dielectric constant of the inter-layer insulator. Namely, in order to reduce the parasitic capacitance between the interconnections, it is required to reduce the dielectric constant of the inter-layer insulator. The silica film is advantageous in matching with LSI processes but is was difficult to largely reduce the dielectric constant from $\in r=3.9$.

In 1994 Dry Process Symposium pp. 133., it is disclosed to have proposed introduction of fluorine into a silica film to attempt to reduce the dielectric constant. In order to reduce the dielectric constant to about 3.5, it is required to add fluorine into the silica film at several tends percents, whereby the silica film exhibits a hygroscopic property and also a hydrolysis of fluorine is caused. As a result, fluorine is unstable in the silica film. For this reason, it was difficult to reduce the dielectric constant of the fluoro-containing silica film to less than about 3.5.

It is disclosed to have proposed the use of spin coating method to deposit a spin-on-glass film. This spin-on-glass film has a problem with residual solvent or a residual moisture.

In Japanese laid-open patent publication No. 8-227888, it is disclosed to have proposed to add an alkyl group into the silica film by a chemical vapor deposition method. The alkyl group is, however, unstable at high temperature.

In the above circumstances, it had been required to develop a novel silica film free from the above problems and a method of forming the same.

SUMMARY OF THE INVENTION

Accordingly, it is an object of the present invention to provide a novel silica insulation film free from the above problems.

It is a further object of the present invention to provide a novel silica insulation film having a reduced dielectric constant.

It is a still further object of the present invention to provide a novel silica insulation film with a sufficient stability at high temperature.

It is yet a further object of the present invention to provide a novel silica insulation film free of any residual impurity such as moisture.

It is a further more object of the present invention to provide a novel method of forming a silica insulation film free from the above problems.

It is still more object of the present invention to provide a novel method of forming a silica insulation film having a reduced dielectric constant.

It is moreover object of the present invention to provide a novel method of forming a silica insulation film with a sufficient stability at high temperature.

It is another object of the present invention to provide a novel method of forming a silica insulation film free of any residual impurity such as moisture.

It is still another object of the present invention to provide a semiconductor device having a multi-level interconnection structure with an improved silica inter-layer insulator free from the above problems.

It is yet another object of the present invention to provide a semiconductor device having a multi-level interconnection structure with an improved silica inter-layer insulator having a reduced dielectric constant.

It is further another object of the present invention to provide a semiconductor device having a multi-level interconnection structure with an improved silica inter-layer insulator with a sufficient stability at high temperature.

It is an additional object of the present invention to provide a semiconductor device having a multi-level interconnection structure with an improved silica inter-layer insulator free of any residual impurity such as moisture.

It is a still additional object of the present invention to provide a semiconductor device having a multi-level interconnection structure with improved silica inter-layer insulator which is capable of reducing a parasitic capacitance between interconnections.

It is yet an additional object of the present invention to provide a semiconductor device having a multi-level interconnection structure with an improved silica inter-layer insulator which is capable of having the semiconductor device free from a problem with a substantive delay of signal transmissions on interconnections due to a parasitic capacitance between the interconnections.

It is a further additional object of the present invention to provide a semiconductor device having a multi-level interconnection structure with an improved silica inter-layer insulator which is capable of having the semiconductor device free from another problem with a crosstalk between the interconnections.

It is also additional object of the present invention to provide a semiconductor device having a multi-level interconnection structure with an improved silica inter-layer insulator which allows the semiconductor device to exhibit high speed performances.

It is also additional object of the present invention to provide a semiconductor device having a multi-level interconnection structure with an improved silica inter-layer insulator which allows a scaling down of the semiconductor device.

It is also additional object of the present invention to provide a method of forming a semiconductor device having a multi-level interconnection structure with an improved silica inter-layer insulator free from the above problems.

It is also additional object of the present invention to provide a method of forming a semiconductor device having a multi-level interconnection structure with an improved silica inter-layer insulator having a reduced dielectric constant.

It is also additional object of the present invention to provide a method of forming a semiconductor device having a multi-level interconnection structure with an improved silica inter-layer insulator with a sufficient stability at high temperature.

It is also additional object of the present invention to provide a method of forming a semiconductor device having a multi-level interconnection structure with an improved silica inter-layer insulator free of any residual impurity such as moisture.

It is also additional object of the present invention to provide a method of forming a semiconductor device having a multi-level interconnection structure with an improved silica inter-layer insulator which is capable of reducing a parasitic capacitance between interconnections.

It is also additional object of the present invention to provide a method of forming a semiconductor device having a multi-level interconnection structure with an improved silica inter-layer insulator which is capable of having the semiconductor device free from a problem with a substantive delay of signal transmissions on interconnections due to a parasitic capacitance between the interconnections.

It is also additional object of the present invention to provide a method of forming a semiconductor device having a multi-level interconnection structure with an improved silica inter-layer insulator which is capable of having the semiconductor device free from another problem with a crosstalk between the interconnections.

It is also additional object of the present invention to provide a method of forming a semiconductor device having a multi-level interconnection structure with an improved silica inter-layer insulator which allows the semiconductor device to exhibit high speed performances.

It is also additional object of the present invention to provide a method of forming a semiconductor device having a multi-level interconnection structure with an improved silica inter-layer insulator which allows a scaling down of the semiconductor device.

The present invention provides an insulator having a main component of silicon dioxide, wherein the insulator includes at least one kind of organic polymer distributed therein. The distribution of at least one kind of organic polymer in the insulator having a main component of silicon dioxide or silica would result in drop of a dielectric constant of the insulator. Namely, the insulator having a main component of silicon dioxide including organic polymer distributed therein has a lower dielectric constant than a dielectric constant of insulator having a main component of silicon dioxide free of any organic polymer. The presence of the distributed organic polymer contributes to prevent formation of Si—O bonding at a high density. This results in a certain drop of a density of the insulator having the main component of silicon dioxide or the silicon dioxide insulator The drop of the density of the insulator results in a reduction in dielectric constant thereof. Further, the introduction of the organic polymer into silicon dioxide changes the Si—O bonding in silicon dioxide to other bonding structures between silicon and organic polymer. Such change of the bonding structure causes a change in state of electrons so that electronic polarization is reduced. If electronic polarization is decreased, then the dielectric constant is also decreased. For this reason, the introduction of the organic polymer into silicon dioxide causes the decrease in dielectric constant of the insulator having the main component of silicon dioxide.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
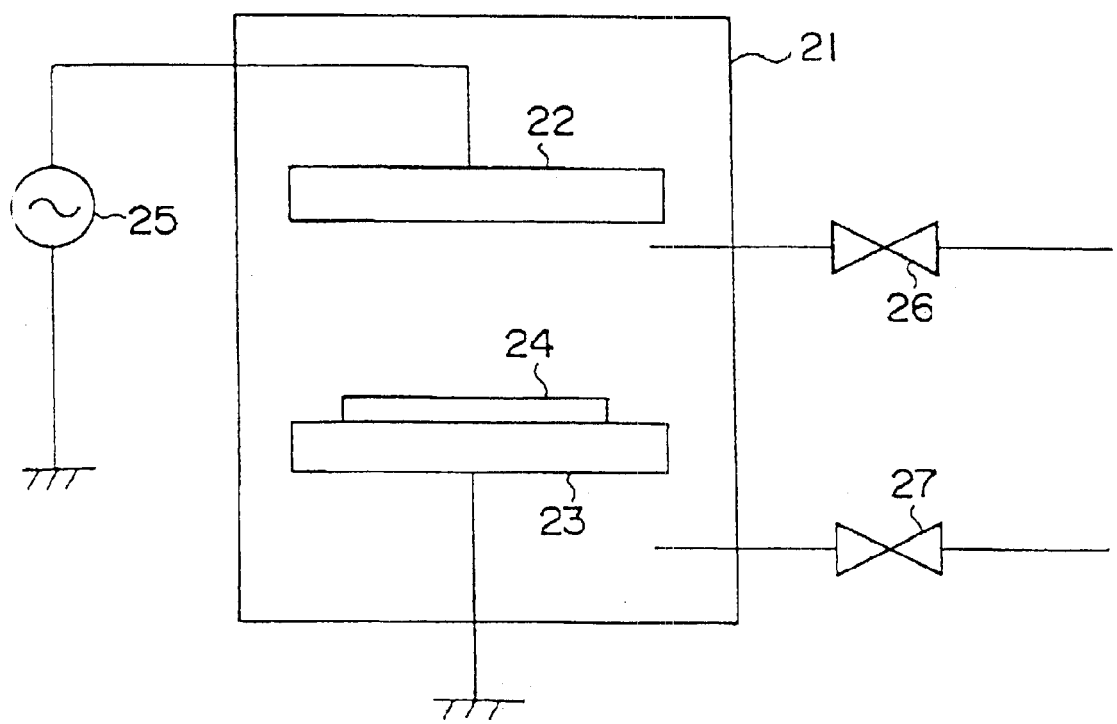
FIG. 1 is a schematic view illustrative of a parallel-plate plasma chemical vapor deposition system used for forming a silica insulation film including benzene nucleuses distributed herein in accordance with the present invention.

The first present invention provides an insulator having a main component of silicon dioxide, wherein the insulator includes at least one kind of organic polymer distributed therein. The distribution of at least one kind of organic polymer in the insulator having a main component of silicon dioxide or silica would result in drop of a dielectric constant of the insulator. Namely, the insulator having a main component of silicon dioxide including organic polymer distributed therein has a lower dielectric constant than a dielectric constant of insulator having a main component of silicon dioxide free of any organic polymer. The presence of the distributed organic polymer contributes to prevent formation of Si—O bonding at a high density. This results in a certain drop of a density of the insulator having the main component of silicon dioxide or the silicon dioxide insulator. The drop of the density of the insulator results in a reduction in dielectric constant thereof. Further, the introduction of the organic polymer into silicon dioxide changes the Si—O bonding in silicon dioxide to other bonding structures between silicon and organic polymer. Such change of the bonding structure causes a change in state of electrons so that electronic polarization is reduced. If electronic polarization is decreased, then the dielectric constant is also decreased. For this reason, the introduction of the organic polymer into silicon dioxide causes the decrease in dielectric constant of the insulator having the main component of silicon dioxide.

It is preferable that the organic polymer has a bridge structure having strong bonding in order to provide a stability at high temperature to the insulator. If the insulator having the main component of silicon dioxide includes the organic polymer with the bridge structure having strong bonding, then the insulator has a high stability at high temperature and a high decomposition resistivity but has a low volatility. This insulator is stable. This properties of the high stability at high temperature and the high decomposition resistivity but the low volatility of the insulator allows the increase in content of the organic component in the insulator. The increase in content of the organic component in the insulator results in further reduction in dielectric constant of the insulator having the main component of silicon dioxide with keeping the advantageous and desirable properties of the high stability at high temperature and the high decomposition resistivity but the low volatility of the insulator.

It is further preferable that the organic polymer comprises a benzene nucleus. The distribution of at least one kind of benzene nucleuses in the insulator having a main component of silicon dioxide or silica would result in drop of a dielectric constant of the insulator. Namely, the insulator having a main component of silicon dioxide including benzene nucleuses distributed therein has a lower dielectric constant than a dielectric constant of insulator having a main component of silicon dioxide free of any benzene nucleuses. The presence of the distributed benzene nucleuses contributes to prevent formation of Si—O bonding at a high density. This results in a certain drop of a density of the insulator having the main component of silicon dioxide or the silicon dioxide insulator. The drop of the density of the insulator results in a reduction in dielectric constant thereof. Further, the introduction of the benzene nucleuses into silicon dioxide changes the Si—O bonding in silicon dioxide to other bonding structures between silicon and benzene nucleuses. Such change of the bonding structure causes a change in state of electrons so that electronic polarization is reduced. If electronic polarization is decreased, then the dielectric constant is also decreased. For this reason, the introduction of the benzene nucleuses into silicon dioxide causes the decrease in dielectric constant of the insulator having the main component of silicon dioxide. The benzene nucleuses has a bridge structure having strong bonding in order to provide a stability at high temperature to the insulator. If the insulator having the main component of silicon dioxide includes the benzene nucleuses with the bridge structure having strong bonding, then the insulator has a high stability at high temperature and a high decomposition resistivity but has a low volatility. This insulator is stable. This properties of the high stability at high temperature and the high decomposition resistivity but the low volatility of the insulator allows the increase in content of the organic component in the insulator. The increase in content of the organic component in the insulator results in further reduction in dielectric constant of the insulator having the main component of silicon dioxide with keeping the advantageous and desirable properties of the high stability at high temperature and the high decomposition resistivity but the low volatility of the insulator.

It is furthermore preferable that the benzene nucleus has a bonding structure with silicon atoms. This bonding structure may be formed by use of phenyltrimethylsilane or phenyltrimethoxysilane as a benzene nucleus source in a chemical vapor deposition for forming the insulator.

It is also preferable that the benzene nucleus is free of a bonding structure with silicon atoms. This bonding structure may be formed by use of an organic substance which has a structure of a single benzene nucleus, for example, toluene, benzene and xylene. Alternatively, an organic substance having a structure of a plurality of benzene nucleuses, for example, naphthalene, biphenyl and anthracene are also available.

It is also preferable that the insulator has a carbon content of not higher than 30 at %.

The second present invention provides an insulator having a main component of silicon dioxide, wherein the insulator includes pores having been formed by a removal of at least one kind of organic polymer distributed in the insulator. The presence of many pores in the insulator having the main component of silicon dioxide results in a further reduction of dielectric constant of the insulator. The silicon dioxide insulator many pores distributed therein has a lower dielectric constant than the dielectric constant of the silicon dioxide insulator including the organic polymer distributed therein.

It is preferable that the insulator includes pores having been formed by a removal of the organic polymer which has a bridge structure with strong bonding. The presence of many pores in the insulator having the main component of silicon dioxide results in a further reduction of dielectric constant of the insulator. The silicon dioxide insulator many pores distributed therein has a lower dielectric constant than the dielectric constant of the silicon dioxide insulator including the organic polymer distributed therein.

It is further preferable that the insulator includes pores having been formed by a removal of benzene nucleuses. The presence of many pores in the insulator having the main component of silicon dioxide results in a further reduction of dielectric constant of the insulator. The silicon dioxide insulator many pores distributed therein has a lower dielectric constant than the dielectric constant of the silicon dioxide insulator including the organic polymer distributed therein.

It is furthermore preferable that the insulator includes pores having been formed by a removal of benzene nucleuses having a bonding structure with silicon atoms.

It is also preferable that the insulator includes pores having been formed by a removal of benzene nucleuses free of a bonding structure with silicon atoms.

It is also preferable that the insulator includes pores having been formed by a removal of benzene nucleuses distributed in the insulator at an amount corresponding to a carbon content of not higher than 30 at %.

The third present invention provides an insulation film provided in a semiconductor device. The insulation film has a main component of silicon dioxide, wherein the insulation film includes at least one kind of organic polymer distributed therein. The distribution of at least one kind of organic polymer in the insulation film having a main component of silicon dioxide or silica would result in drop of a dielectric constant of the insulation film. Namely, the insulation film having a main component of silicon dioxide including organic polymer distributed therein has a lower dielectric constant than a dielectric constant of insulation film having a main component of silicon dioxide free of any organic polymer. The presence of the distributed organic polymer contributes to prevent formation of Si—O bonding at a high density. This results in a certain drop of a density of the insulation film having the main component of silicon dioxide or the silicon dioxide insulation film. The drop of the density of the insulation film results in a reduction in dielectric constant thereof. Further, the introduction of the organic polymer into silicon dioxide changes the Si—O bonding in silicon dioxide to other bonding structures between silicon and organic polymer. Such change of the bonding structure causes a change in state of electrons so that electronic polarization is reduced. If electronic polarization is decreased, then the dielectric constant is also decreased. For this reason, the introduction of the organic polymer into silicon dioxide causes the decrease in dielectric constant of the insulation film having the main component of silicon dioxide.

It is preferable that the organic polymer has a bridge structure having strong bonding in order to provide a stability at high temperature to the insulation film. If the insulation film having the main component of silicon dioxide includes the organic polymer with the bridge structure having strong bonding, then the insulation film has a high stability at high temperature and a high decomposition resistivity but has a low volatility. This insulation film is stable. This properties of the high stability at high temperature and the high decomposition resistivity but the low volatility of the insulation film allows the increase in content of the organic component in the insulation film. The increase in content of the organic component in the insulation film results in further reduction in dielectric constant of the insulation film having the main component of silicon dioxide with keeping the advantageous and desirable properties of the high stability at high temperature and the high decomposition resistivity but the low volatility of the insulation film.

It is further preferable that the organic polymer comprises a benzene nucleus. The distribution of at least one kind of benzene nucleuses in the insulation film having a main component of silicon dioxide or silica would result in drop of a dielectric constant of the insulation film. Namely, the insulation film having a main component of silicon dioxide including benzene nucleuses distributed therein has a lower dielectric constant than a dielectric constant of insulation film having a main component of silicon dioxide free of any benzene nucleuses. The presence of the distributed benzene nucleuses contributes to prevent formation of Si—O bonding at a high density. This results in a certain drop of a density of the insulation film having the main component of silicon dioxide or the silicon dioxide insulation film. The drop of the density of the insulation film results in a reduction in dielectric constant thereof. Further, the introduction of the benzene nucleuses into silicon dioxide changes the Si—O bonding in silicon dioxide to other bonding structures between silicon and benzene nucleuses. Such change of the bonding structure causes a change in state of electrons so that electronic polarization is reduced. If electronic polarization is decreased, then the dielectric constant is also decreased. For this reason, the introduction of the benzene nucleuses into silicon dioxide causes the decrease in dielectric constant of the insulation film having the main component of silicon dioxide. The benzene nucleuses has a bridge structure having strong bonding in order to provide a stability at high temperature to the insulation film. If the insulation film having the main component of silicon dioxide includes the benzene nucleuses with the bridge structure having strong bonding, then the insulation film has a high stability at high temperature and a high decomposition resistivity but has a low volatility. This insulation film is stable. This properties of the high stability at high temperature and the high decomposition resistivity but the low volatility of the insulation film allows the increase in content of the organic component in the insulation film. The increase in content of the organic component in the insulation film results in further reduction in dielectric constant of the insulation film having the main component of silicon dioxide with keeping the advantageous and desirable properties of the high stability at high temperature and the high decomposition resistivity but the low volatility of the insulation film.

It is furthermore preferable that the benzene nucleus has a bonding structure with silicon atoms. This bonding structure may be formed by use of phenyltrimethylsilane or phenyltrimethoxysilane as a benzene nucleus source in a chemical vapor deposition for forming the insulation film.

It is also preferable that the benzene nucleus is free of a bonding structure with silicon atoms. This bonding structure may be formed by use of an organic substance which has a structure of a single benzene nucleus, for example, toluene, benzene and xylene. Alternatively, an organic substance having a structure of a plurality of benzene nucleuses, for example, naphthalene, biphenyl and anthracene are also available.

It is also preferable that the insulation film has a carbon content of not higher than 30 at %.

The fourth present invention provides an insulation film provided in a semiconductor device. The insulation film has a main component of silicon dioxide, wherein the insulation film includes pores having been formed by a removal of at least one kind of organic polymer distributed in the insulation film. The presence of many pores in the insulation film having the main component of silicon dioxide results in a further reduction of dielectric constant of the insulation film. The silicon dioxide insulation film many pores distributed therein has a lower dielectric constant than the dielectric constant of the silicon dioxide insulation film including the organic polymer distributed therein.

It is preferable that the insulation film includes pores having been formed by a removal of the organic polymer which has a bridge structure with strong bonding. The presence of many pores in the insulation film having the main component of silicon dioxide results in a further reduction of dielectric constant of the insulation film. The silicon dioxide insulation film many pores distributed therein has a lower dielectric constant than the dielectric constant of the silicon dioxide insulation film including the organic polymer distributed therein.

It is further preferable that the insulation film includes pores having been formed by a removal of benzene nucleuses. The presence of many pores in the insulation film having the main component of silicon dioxide results in a further reduction of dielectric constant of the insulation film. The silicon dioxide insulation film many pores distributed therein has a lower dielectric constant than the dielectric constant of the silicon dioxide insulation film including the organic polymer distributed therein.

It is furthermore preferable that the insulation film includes pores having been formed by a removal of benzene nucleuses having a bonding structure with silicon atoms.

It is also preferable that the insulation film includes pores having been formed by a removal of benzene nucleuses free of a bonding structure with silicon atoms.

It is also preferable that the insulation film includes pores having been formed by a removal of benzene nucleuses distributed in the insulation film at an amount corresponding to a carbon content of not higher than 30 at %.

The fifth present invention provides an inter-layer insulator provided between a first level interconnection layer and a second level interconnection layer which lies over the first level interconnection layer in a semiconductor device. The inter-layer insulator having a main component of silicon dioxide, wherein the inter-layer insulator includes at least one kind of organic polymer distributed therein. The distribution of at least one kind of organic polymer in the inter-layer insulator having a main component of silicon dioxide or silica would result in drop of a dielectric constant of the inter-layer insulator. Namely, the inter-layer insulator having a main component of silicon dioxide including organic polymer distributed therein has a lower dielectric constant than a dielectric constant of inter-layer insulator having a main component of silicon dioxide free of any organic polymer. The presence of the distributed organic polymer contributes to prevent formation of Si—O bonding at a high density. This results in a certain drop of a density of the inter-layer insulator having the main component of silicon dioxide or the silicon dioxide inter-layer insulator. The drop of the density of the inter-layer insulator results in a reduction in dielectric constant thereof. Further, the introduction of the organic polymer into silicon dioxide changes the Si—O bonding in silicon dioxide to other bonding structures between silicon and organic polymer.

Such change of the bonding structure causes a change in state of electrons so that electronic polarization is reduced. If electronic polarization is decreased, then the dielectric constant is also decreased. For this reason, the introduction of the organic polymer into silicon dioxide causes the decrease in dielectric constant of the inter-layer insulator having the main component of silicon dioxide.

It is preferable that the organic polymer has a bridge structure having strong bonding in order to provide a stability at high temperature to the inter-layer insulator. If the inter-layer insulator having the main component of silicon dioxide includes the organic polymer with the bridge structure having strong bonding, then the inter-layer insulator has a high stability at high temperature and a high decomposition resistivity but has a low volatility. This inter-layer insulator is stable. This properties of the high stability at high temperature and the high decomposition resistivity but the low volatility of the inter-layer insulator allows the increase in content of the organic component in the inter-layer insulator. The increase in content of the organic component in the inter-layer insulator results in further reduction in dielectric constant of the inter-layer insulator having the main component of silicon dioxide with keeping the advantageous and desirable properties of the high stability at high temperature and the high decomposition resistivity but the low volatility of the inter-layer insulator.

It is further preferable that the organic polymer comprises a benzene nucleus. The distribution of at least one kind of benzene nucleuses in the inter-layer insulator having a main component of silicon dioxide or silica would result in drop of a dielectric constant of the inter-layer insulator. Namely, the inter-layer insulator having a main component of silicon dioxide including benzene nucleuses distributed therein has a lower dielectric constant than a dielectric constant of inter-layer insulator having a main component of silicon dioxide free of any benzene nucleuses. The presence of the distributed benzene nucleuses contributes to prevent formation of Si—O bonding at a high density. This results in a certain drop of a density of the inter-layer insulator having the main component of silicon dioxide or the silicon dioxide inter-layer insulator. The drop of the density of the inter-layer insulator results in a reduction in dielectric constant thereof. Further, the introduction of the benzene nucleuses into silicon dioxide changes the Si—O bonding in silicon dioxide to other bonding structures between silicon and benzene nucleuses. Such change of the bonding structure causes a change in state of electrons so that electronic polarization is reduced. If electronic polarization is decreased, then the dielectric constant is also decreased. For this reason, the introduction of the benzene nucleuses into silicon dioxide causes the decrease in dielectric constant of the inter-layer insulator having the main component of silicon dioxide. The benzene nucleuses has a bridge structure having strong bonding in order to provide a stability at high temperature to the inter-layer insulator. If the inter-layer insulator having the main component of silicon dioxide includes the benzene nucleuses with the bridge structure having strong bonding, then the inter-layer insulator has a high stability at high temperature and a high decomposition resistivity but has a low volatility. This inter-layer insulator is stable. This properties of the high stability at high temperature and the high decomposition resistivity but the low volatility of the inter-layer insulator allows the increase in content of the organic component in the inter-layer insulator. The increase in content of the organic component in the inter-layer insulator results in further reduction in dielectric constant of the inter-layer insulator having the main component of silicon dioxide with keeping the advantageous and desirable properties of the high stability at high temperature and the high decomposition resistivity but the low volatility of the inter-layer insulator.

It is furthermore preferable that the benzene nucleus has a bonding structure with silicon atoms. This bonding structure may be formed by use of phenyltrimethylsilane or phenyltrimethoxysilane as a benzene nucleus source in a chemical vapor deposition for forming the inter-layer insulator.

It is also preferable that the benzene nucleus is free of a bonding structure with silicon atoms. This bonding structure may be formed by use of an organic substance which has a structure of a single benzene nucleus, for example, toluene, benzene and xylene. Alternatively, an organic substance having a structure of a plurality of benzene nucleuses, for example, naphthalene, biphenyl and anthracene are also available.

It is also preferable that the inter-layer insulator has a carbon content of not higher than 30 at %.

The sixth present invention provides an inter-layer insulator provided between a first level interconnection layer and a second level interconnection layer which lies over the first level interconnection layer in a semiconductor device. The inter-layer insulator has a main component of silicon dioxide, wherein the inter-layer insulator includes pores having been formed by a removal of at least one kind of organic polymer distributed in the inter-layer insulator The presence of many pores in the inter-layer insulator having the main component of silicon dioxide results in a further reduction of dielectric constant of the inter-layer insulator. The silicon dioxide inter-layer insulator many pores distributed therein has a lower dielectric constant than the dielectric constant of the silicon dioxide inter-layer insulator including the organic polymer distributed therein.

It is preferable that the inter-layer insulator includes pores having been formed by a removal of the organic polymer which has a bridge structure with strong bonding. The presence of many pores in the inter-layer insulator having the main component of silicon dioxide results in a further reduction of dielectric constant of the inter-layer insulator. The silicon dioxide inter-layer insulator with many pores distributed therein has a lower dielectric constant than the dielectric constant of the silicon dioxide inter-layer insulator including the organic polymer distributed therein.

It is further preferable that the inter-layer insulator includes pores having been formed by a removal of benzene nucleuses. The presence of many pores in the inter-layer insulator having the main component of silicon dioxide results in a further reduction of dielectric constant of the inter-layer insulator. The silicon dioxide inter-layer insulator many pores distributed therein has a lower dielectric constant than the dielectric constant of the silicon dioxide inter-layer insulator including the organic polymer distributed therein.

It is furthermore preferable that the inter-layer insulator includes pores having been formed by a removal of benzene nucleuses having a bonding structure with silicon atoms.

It is also preferable that the inter-layer insulator includes pores having been formed by a removal of benzene nucleuses free of a bonding structure with silicon atoms.

It is also preferable that the inter-layer insulator includes pores having been formed by a removal of benzene nucleuses distributed in the inter-layer insulator at an amount corresponding to a carbon content of not higher than 30 at %.

The seventh present invention provides a multi-level interconnection structure comprising the following elements. At least a first level interconnection extends on an insulation layer. An inter-layer insulator extends over the insulation layer so that the inter-layer insulator covers the first level interconnection. The inter-layer insulator has at least a via hole. The inter-layer insulator has a main component of silicon dioxide. At least a second level interconnection extends over the inter-layer insulator so that the second level interconnection is separated by the inter-layer insulator from the first level interconnection and so that the second level interconnection is electrically connected through the via hole to the first level interconnection. It is important that the inter-layer insulator includes at least one kind of organic polymer distributed therein. The distribution of at least one kind of organic polymer in the inter-layer insulator having a main component of silicon dioxide or silica would result in drop of a dielectric constant of the inter-layer insulator. Namely, the inter-layer insulator having a main component of silicon dioxide including organic polymer distributed therein has a lower dielectric constant than a dielectric constant of inter-layer insulator having a main component of silicon dioxide free of any organic polymer. The presence of the distributed organic polymer contributes to prevent formation of Si—O bonding at a high density. This results in a certain drop of a density of the inter-layer insulator having the main component of silicon dioxide or the silicon dioxide inter-layer insulator. The drop of the density of the inter-layer insulator results in a reduction in dielectric constant thereof. Further, the introduction of the organic polymer into silicon dioxide changes the Si—O bonding in silicon dioxide to other bonding structures between silicon and organic polymer. Such change of the bonding structure causes a change in state of electrons so that electronic polarization is reduced. If electronic polarization is decreased, then the dielectric constant is also decreased. For this reason, the introduction of the organic polymer into silicon dioxide causes the decrease in dielectric constant of the inter-layer insulator having the main component of silicon dioxide.

It is preferable that the organic polymer has a bridge structure having strong bonding in order to provide a stability at high temperature to the inter-layer insulator. If the inter-layer insulator having the main component of silicon dioxide includes the organic polymer with the bridge structure having strong bonding, then the inter-layer insulator has a high stability at high temperature and a high decomposition resistivity but has a low volatility. This inter-layer insulator is stable. This properties of the high stability at high temperature and the high decomposition resistivity but the low volatility of the inter-layer insulator allows the increase in content of the organic component in the inter-layer insulator. The increase in content of the organic component in the inter-layer insulator results in further reduction in dielectric constant of the inter-layer insulator having the main component of silicon dioxide with keeping the advantageous and desirable properties of the high stability at high temperature and the high decomposition resistivity but the low volatility of the inter-layer insulator.

It is further preferable that the organic polymer comprises a benzene nucleus. The distribution of at least one kind of benzene nucleuses in the inter-layer insulator having a main component of silicon dioxide or silica would result in, drop of a dielectric constant of the inter-layer insulator. Namely, the inter-layer insulator having a main component of silicon dioxide including benzene nucleuses distributed therein has a lower dielectric constant than a dielectric constant of inter-layer insulator having a main component of silicon dioxide free of any benzene nucleuses. The presence of the distributed benzene nucleuses contributes to prevent formation of Si—O bonding at a high density. This results in a certain drop of a density of the inter-layer insulator having the main component of silicon dioxide or the silicon dioxide inter-layer insulator. The drop of the density of the inter-layer insulator results in a reduction in dielectric constant thereof. Further, the introduction of the benzene nucleuses into silicon dioxide changes the Si—O bonding in silicon dioxide to other bonding structures between silicon and benzene nucleuses. Such change of the bonding structure causes a change in state of electrons so that electronic polarization is reduced. If electronic polarization is decreased, then the dielectric constant is also decreased. For this reason, the introduction of the benzene nucleuses into silicon dioxide causes the decrease in dielectric constant of the inter-layer insulator having the main component of silicon dioxide. The benzene nucleuses has a bridge structure having strong bonding in order to provide a stability at high temperature to the inter-layer insulator. If the inter-layer insulator having the main component of silicon dioxide includes the benzene nucleuses with the bridge structure having strong bonding, then the inter-layer insulator has a high stability at high temperature and a high decomposition resistivity but has a low volatility. This inter-layer insulator is stable. This properties of the high stability at high temperature and the high decomposition resistivity but the low volatility of the inter-layer insulator allows the increase in content of the organic component in the inter-layer insulator. The increase in content of the organic component in the inter-layer insulator results in further reduction in dielectric constant of the inter-layer insulator having the main component of silicon dioxide with keeping the advantageous and desirable properties of the high stability at high temperature and the high decomposition resistivity but the low volatility of the inter-layer insulator.

It is furthermore preferable that the benzene nucleus has a bonding structure with silicon atoms. This bonding structure may be formed by use of phenyltrimethylsilane or phenyltrimethoxysilane as a benzene nucleus source in a chemical vapor deposition for forming the inter-layer insulator.

It is also preferable that the benzene nucleus is free of a bonding structure with silicon atoms. This bonding structure may be formed by use of an organic substance which has a structure of a single benzene nucleus, for example, toluene, benzene and xylene. Alternatively, an organic substance having a structure of a plurality of benzene nucleuses, for example, naphthalene, biphenyl and anthracene are also available.

It is also preferable that the inter-layer insulator has a carbon content of not higher than 30 at %.

The eighth present invention provides a multi-level interconnection structure comprising the following elements. At least a first level interconnection extends on an insulation layer. An inter-layer insulator extends over the insulation layer so that the inter-layer insulator covers the first level interconnection. The inter-layer insulator has at least a via hole. The inter-layer insulator has a main component of silicon dioxide. At least a second level interconnection extends over the inter-layer insulator so that the second level interconnection is separated by the inter-layer insulator from the first level interconnection and so that the second level interconnection is electrically connected through the via hole to the first level interconnection. It is important that the inter-layer insulator includes pores having been formed by a removal of at least one kind of organic polymer distributed in the inter-layer insulator. The presence of many pores in the inter-layer insulator having the main component of silicon dioxide results in a further reduction of dielectric constant of the inter-layer insulator. The silicon dioxide inter-layer insulator many pores distributed therein has a lower dielectric constant than the dielectric constant of the silicon dioxide inter-layer insulator including the organic polymer distributed therein.

It is preferable that the inter-layer insulator includes pores having been formed by a removal of the organic polymer which has a bridge structure with strong bonding. The presence of many pores in the inter-layer insulator having the main component of silicon dioxide results in a further reduction of dielectric constant of the inter-layer insulator. The silicon dioxide inter-layer insulator many pores distributed therein has a lower dielectric constant than the dielectric constant of the silicon dioxide inter-layer insulator including the organic polymer distributed therein.

It is further preferable that the inter-layer insulator includes pores having been formed by a removal of benzene nucleuses. The presence of many pores in the inter-layer insulator having the main component of silicon dioxide results in a further reduction of dielectric constant of the inter-layer insulator. The silicon dioxide inter-layer insulator many pores distributed therein has a lower dielectric constant than the dielectric constant of the silicon dioxide inter-layer insulator including the organic polymer distributed therein.

It is furthermore preferable that the inter-layer insulator includes pores having been formed by a removal of benzene nucleuses having a bonding structure with silicon atoms.

It is also preferable that the inter-layer insulator includes pores having been formed by a removal of benzene nucleuses free of a bonding structure with silicon atoms.

It is also preferable that the inter-layer insulator includes pores having been formed by a removal of benzene nucleuses distributed in the inter-layer insulator at an amount corresponding to a carbon content of not higher than 30 at %.

The ninth present invention provides a method of forming an insulator having a main component of silicon dioxide by a chemical vapor deposition method, wherein at least one kind of organic substance including benzene nucleuses is used as a benzene nucleus source so that the insulator includes the benzene nucleuses. The distribution of at least one kind of benzene nucleuses in the inter-layer insulator having a main component of silicon dioxide or silica would result in drop of a dielectric constant of the inter-layer insulator. Namely, the inter-layer insulator having a main component of silicon dioxide including benzene nucleuses distributed therein has a lower dielectric constant than a dielectric constant of inter-layer insulator having a main component of silicon dioxide free of any benzene nucleuses. The presence of the distributed benzene nucleuses contributes to prevent formation of Si—O bonding at a high density. This results in a certain drop of a density of the inter-layer insulator having the main component of silicon dioxide or the silicon dioxide inter-layer insulator. The drop of the density of the inter-layer insulator results in a reduction in dielectric constant thereof. Further, the introduction of the benzene nucleuses into silicon dioxide changes the Si—O bonding in silicon dioxide to other bonding structures between silicon and benzene nucleuses. Such change of the bonding structure causes a change in state of electrons so that electronic polarization is reduced. If electronic polarization is decreased, then the dielectric constant is also decreased. For this reason, the introduction of the benzene nucleuses into silicon dioxide causes the decrease in dielectric constant of the inter-layer insulator having the main component of silicon dioxide. The benzene nucleuses has a bridge structure having strong bonding in order to provide a stability at high temperature to the inter-layer insulator. If the inter-layer insulator having the main component of silicon dioxide includes the benzene nucleuses with the bridge structure having strong bonding, then the inter-layer insulator has a high stability at high temperature and a high decomposition resistivity but has a low volatility. This inter-layer insulator is stable. This properties of the high stability at high temperature and the high decomposition resistivity but the low volatility of the inter-layer insulator allows the increase in content of the organic component in the inter-layer insulator. The increase in content of the organic component in the inter-layer insulator results in further reduction in dielectric constant of the inter-layer insulator having the main component of silicon dioxide with keeping the advantageous and desirable properties of the high stability at high temperature and the high decomposition resistivity but the low volatility of the inter-layer insulator.

It is preferable that the benzene nucleus has a bonding structure with silicon atoms.

It is further preferable that at least one selected from the group consisting of phenyltrimethylsilane and phenyltrimethoxysilane is used as the benzene nucleus source.

It is also preferable that the organic substance as the benzene nucleus source is used together with a silicon source material.

It is also preferable that the organic substance as the benzene nucleus source is used alone without any silicon source material.

It is also preferable that the benzene nucleus is free of a bonding structure with silicon atoms and the organic substance as the benzene nucleus source is used together with a silicon source material.

It is further preferable that the organic substance has a structure of a single benzene nucleus.

It is furthermore preferable that the organic substance comprises at least one selected from the group consisting of toluene, benzene and xylene.

It is also preferable that the organic substance has a structure of a plurality of benzene nucleuses.

It is further preferable that the organic substance comprises at least one selected from the group consisting of naphthalene, biphenyl and anthracene.

It is also preferable that the chemical vapor deposition method is a plasma chemical vapor deposition method. For example, a parallel-plate plasma chemical vapor deposition method, an electron cyclotron resonance plasma chemical vapor deposition method, a helicon wave plasma chemical vapor deposition method, and an inductively coupled plasma chemical vapor deposition method are available It is also preferable that the chemical vapor deposition method is a low pressure chemical vapor deposition method.

It is also preferable that after the insulator has been formed by the chemical vapor deposition method, then the benzene nucleuses are removed from the insulator thereby to form many pores in the insulator. The presence of many pores in the insulator having the main component of silicon dioxide- results in a further reduction of dielectric constant of the insulator. The silicon dioxide insulator many pores distributed therein has a lower dielectric constant than the dielectric constant of the silicon dioxide insulator including the organic polymer distributed therein.

It is further preferable that the benzene nucleuses are removed by causing an elimination reaction for eliminating benzene nucleuses from the insulator.

It is furthermore preferable that the elimination reaction is caused by exposure to oxygen radicals generated in a plasma.

It is moreover preferable that the elimination reaction is caused by a heat treatment in a vacuum at a temperature of not less than 450° C.

It is still more preferable that the elimination reaction is caused by a heat treatment in an inert gas atmosphere at a temperature of not less than 450° C.

It is also preferable that the benzene nucleuses are removed by causing a combustion reaction in an oxygen atmosphere.

It is also preferable that the chemical vapor deposition method is carried out by maintaining a temperature of not less than about 500° C. so as to cause elimination reaction of the benzene nucleuses at the same time of deposition of the insulator, thereby to form the insulator including pores.

The tenth present invention provides a method of forming an insulation film having a main component of silicon dioxide in a semiconductor device by a chemical vapor deposition method, wherein at least one kind of organic substance including benzene nucleuses is used as a benzene nucleus source so that the insulation film includes the benzene nucleuses. The distribution of at least one kind of benzene nucleuses in the inter-layer insulator having a main component of silicon dioxide or silica would result in drop of a dielectric constant of the inter-layer insulator. Namely, the inter-layer insulator having a main component of silicon dioxide including benzene nucleuses distributed therein has a lower dielectric constant than a dielectric constant of inter-layer insulator having a main component of silicon dioxide free of any benzene nucleuses. The presence of the distributed benzene nucleuses contributes to prevent formation of Si—O bonding at a high density. This results in a certain drop of a density of the inter-layer insulator having the main component of silicon dioxide or the silicon dioxide inter-layer insulator. The drop of the density of the inter-layer insulator results in a reduction in dielectric constant thereof. Further, the introduction of the benzene nucleuses into silicon dioxide changes the Si—O bonding in silicon dioxide to other bonding structures between silicon and benzene nucleuses. Such change of the bonding structure causes a change in state of electrons so that electronic polarization is reduced. If electronic polarization is decreased, then the dielectric constant is also decreased. For this reason, the introduction of the benzene nucleuses into silicon dioxide causes the decrease in dielectric constant of the inter-layer insulator having the main component of silicon dioxide. The benzene nucleuses has a bridge structure having strong bonding in order to provide a stability at high temperature to the inter-layer insulator. If the inter-layer insulator having the main component of silicon dioxide includes the benzene nucleuses with the bridge structure having strong bonding, then the inter-layer insulator has a high stability at high temperature and a high decomposition resistivity but has a low volatility. This inter-layer insulator is stable. This properties of the high stability at high temperature and the high decomposition resistivity but the low volatility of the inter-layer insulator allows the increase in content of the organic component in the inter-layer insulator.

The increase in content of the organic component in the inter-layer insulator results in further reduction in dielectric constant of the inter-layer insulator having the main component of silicon dioxide with keeping the advantageous and desirable properties of the high stability at high temperature and the high decomposition resistivity but the low volatility of the inter-layer insulator.

It is preferable that the benzene nucleus has a bonding structure with silicon atoms.

It is further preferable that at least one selected from the group consisting of phenyltrimethylsilane and phenyltrimethoxysilane is used as the benzene nucleus source.

It is also preferable that the organic substance as the benzene nucleus source is used together with a silicon source material.

It is furthermore preferable that the organic substance as the benzene nucleus source is used alone without any silicon source material.

It is also preferable that the benzene nucleus is free of a bonding structure with silicon atoms and the organic substance as the benzene nucleus source is used together with a silicon source material.

It is further preferable that the organic substance has a structure of a single benzene nucleus.

It is furthermore preferable that the organic substance comprises at least one selected from the group consisting of toluene, benzene and xylene.

It is also preferable that the organic substance has a structure of a plurality of benzene nucleuses.

It is further preferable that the organic substance comprises at least one selected from the group consisting of naphthalene, biphenyl and anthracene.

It is also preferable that the chemical vapor deposition method is a plasma chemical vapor deposition method. For example, a parallel-plate plasma chemical vapor deposition method, an electron cyclotron resonance plasma chemical vapor deposition method, a helicon wave plasma chemical vapor deposition method, and an inductively coupled plasma chemical vapor deposition method are available.

It is also preferable that the chemical vapor deposition method is a low pressure chemical vapor deposition method.

It is also preferable that after the insulation film has been formed by the chemical vapor deposition method, then the benzene nucleuses are removed from the insulation film thereby to form pores in the insulation film. The presence of many pores in the insulation film having the main component of silicon dioxide results in a further reduction of dielectric constant of the insulation film. The silicon dioxide insulation film many pores distributed therein has a lower dielectric constant than the dielectric constant of the silicon dioxide insulation film including the organic polymer distributed therein.

It is further preferable that the benzene nucleuses are removed by causing an elimination reaction for eliminating benzene nucleuses from the insulation film.

It is furthermore preferable that the elimination reaction is caused by exposure to oxygen radicals generated in a plasma.

It is also preferable that the elimination reaction is caused by a heat treatment in a vacuum at a temperature of not less than 450° C.

It is also preferable that the elimination reaction is caused by a heat treatment in an inert gas atmosphere at a temperature of not less than 450° C.

It is also preferable that the benzene nucleuses are removed by causing a combustion reaction in an oxygen atmosphere.

It is also preferable that the chemical vapor deposition method is carried out by maintaining a temperature of not less than about 500° C. so as to cause elimination reaction of the benzene nucleuses at the same time of deposition of the insulation film, thereby to form the insulation film including pores.

PREFERRED EMBODIMENTS

First Embodiment:

A first embodiment according to the present invention will be described in detail wherein there is provided a method of forming a silica film including benzene nucleuses with a reduced dielectric constant over a silicon substrate by a chemical vapor deposition method. FIG. 1 is a schematic view illustrative of a parallel-plate plasma chemical vapor deposition system used in this first embodiment in accordance with the present invention. The parallel-plate plasma chemical vapor deposition system has a reaction chamber 21 which accommodates a top electrode 22 and a bottom electrode 23. A silicon substrate 24 is placed on the bottom electrode 23. The bottom electrode 23 is connected to a ground line so that the bottom electrode 23 is kept to have a ground potential. The top electrode 22 is connected to a high frequency power source 25 for receiving a high frequency power from the high frequency power source 25. Further a heater not illustrated is provided adjacent to the bottom electrode 23 for heating the silicon substrate 24. The reaction chamber 21 is connected to a source gas introduction system 26 through which source gases are fed into the reaction chamber 21. The reaction chamber 21 is further connected to a gas discharge system 27 by which used gases are discharged from the reaction chamber 21.

In this first embodiment, phenyltrimethylsilane, silane and oxygen are used as source gases for formation of a silica insulation film by a plasma chemical vapor deposition method. The individual source gases are subjected to flow rate controls by a mass flow controller not illustrated for subsequent introductions thereof through the source gas introduction system 26 into the reaction chamber 21. Phenyltrimethylsilane has a bonding structure of silicon to benzene nucleus. Phenyltrimethylsilane is reacted with an oxidant to form a silica film including benzene nucleuses.

Phenyltrimethylsilane is in a liquid state at room temperature.

Phenyltrimethylsilane has a boiling point of 169° C. Phenyltrimethylsilane in liquid state is first filled in a stainless cylinder for vacuuming the stainless cylinder and subsequent heating the stainless cylinder up to about 100° C. The source gas introduction system 26 including the mass flow controller and the reaction chamber 21 are also heated up to about 150° C. for prevention of condensation of phenyltrimethylsilane so as to allow phenyltrimethylsilane in gas state to be fed through the source gas introduction system 26 into the reaction chamber 21. Silane and oxygen are also fed through the source gas introduction system 26 into the reaction chamber 21.

The silicon substrate 24 comprises a silicon wafer covered by an aluminum layer and is placed on the bottom electrode 23. The parallel-plate plasma chemical vapor deposition is carried out under the following conditions. A flow rate of silane is varied in the range of 0 sccm to 50 sccm. A flow rate of phenyltrimethylsilane is also varied in the range of 0 sccm to 50 sccm. A flow rate of oxygen is set 100 sccm. A pressure is set 0.1 Torr. A high frequency power of 500 W is applied to the top electrode 22. The substrate temperature is maintained at 300° C.

Figure 2:
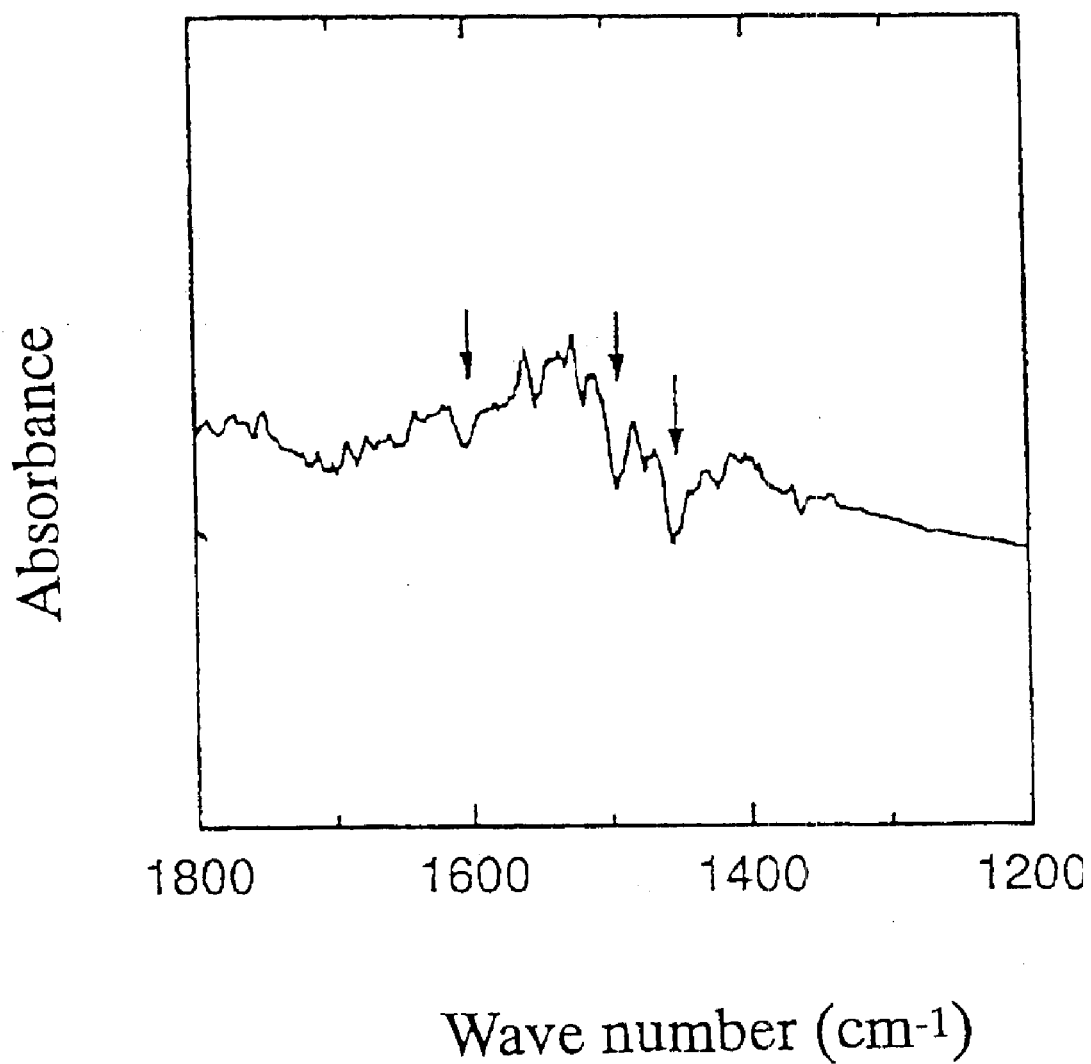
FIG. 2 is a diagram illustrative of measured infrared absorption spectrum of the silica film over wave number when the silica film is deposited under conditions of a silane flow rate of zero and a phenyltrimethylsilane flow rate of 50 sccm in accordance with the present invention.

A measurement of an infrared absorption spectrum is made in order to confirm whether or not the silane insulation film does include benzene nucleuses. FIG. 2 is a diagram illustrative of measured infrared absorption spectrum of the silica film over wave number when the silica film is deposited under conditions of a silane flow rate of zero and a phenyltrimethylsilane flow rate of 50 sccm. Absorption lines appear at wave numbers of about 1450 cm$^{-1}$, 1500 cm$^{-1}$ and 1600 cm$^{-1}$. Those absorption lines show absorptions of infrared ray due to the benzene nucleuses. No hydrocarbon composition other than benzene nucleus could be detected. The above matters show that if phenyltrimethylsilane having a bonding structure of silicon with benzene nucleuses is used as a source gas for the plasma chemical vapor deposition method, then the silica film having the benzene nucleuses is formed. In accordance with the above infrared absorption spectrum, no Si—OH bonding due to moisture in the silica film is detected. This means that the silica film is free of residual moisture.

Further, the flow rates of phenyltrimethylsilane and silane are changed for the further plasma chemical vapor depositions of the other silica films so that compositions of the silica film and dielectric constants thereof are measured. For measuring each of the dielectric constants of the silica films, an additional electrode is provided on the silica film having the benzene nucleuses so that a capacity between the additional electrode and the substrate is measured. From the above analysis of the compositions of the silica film, it could be understood that if only silane is used for the plasma chemical vapor deposition, then the silica film includes no benzene nucleuses. If a flow rate ratio of phenyltrimethylsilane having a bonding structure of silicon with benzene nucleus is increased, then a carbon content of the silica film is also increased. This means that if the flow rate ratio of phenyltrimethylsilane having the bonding structure of silicon with benzene nucleus is increased, then an amount of benzene nucleus in the silica film is also increased. If only phenyltrimethylsilane is used without use of silane for the plasma chemical vapor deposition, then the silica film has a carbon content of about 30 at %. As a result of measuring the dielectric constant of the silica film, it is also understood that if the carbon content of the silica film is increased, then the dielectric constant of the silica film is decreased. For example, if silane only is used, then the silica film has a dielectric constant of ∈r=4 which almost corresponds to the dielectric constant of silica The increase in flow rate ratio of phenyltrimethylsilane to silane results in a decrease in dielectric constant of the silica film. If phenyltrimethylsilane only is used for the plasma chemical vapor deposition, then the silica film has a dielectric constant of ∈r=3.

The above experimental results show that it is possible to form the silica film including the benzene nucleuses by use of phenyltrimethylsilane having a bonding structure of silicon with benzene nucleuses as the source gas. It is also possible to control the content of benzene nucleuses in the silica film by controlling the amount of phenyltrimethylsilane. Namely, the increase in the amount of phenyltrimethylsilane results in an increase in amount of the benzene nucleuses in the silica film, whereby the dielectric constant of the silica film is decreased. If phenyltrimethylsilane is used alone for the plasma chemical vapor deposition, then the carbon content of the silica film is about 30 at % and the dielectric constant thereof is about ∈r=3. Further, phenyltrimethylsilane in a gas state is fed to the reaction chamber for subsequent plasma chemical vapor deposition, for which reason it is possible to form the silica film including the benzene nucleuses free of substantive residual impurity, particularly residual moisture. Furthermore, the benzene nucleuses with strong bonding in the silica film are stable among organic polymers to provide the silica film with a stability at high temperature.

In this embodiment, the plasma chemical vapor deposition was carried out by use of the parallel-plate plasma chemical vapor deposition apparatus. Notwithstanding, any other plasma chemical vapor deposition methods are also available. For example, it was confirmed that, for forming the silica film including the benzene nucleuses by use of phenyltrimethylsilane, there are available an electron cyclotron resonance plasma chemical vapor deposition method, a helicon wave plasma chemical vapor deposition method, and an inductive coupled plasma chemical vapor deposition method.

Second Embodiment:

A second embodiment according to the present invention will be described in detail with reference again to FIGS. 1 and 2, wherein another method of forming a silica film including benzene nucleuses with a reduced dielectric constant over a silicon substrate by a chemical vapor deposition method. In this embodiment, the same parallel-plate plasma chemical vapor deposition system as in the first embodiment is used. Detailed descriptions of the parallel-plate plasma chemical vapor deposition system with reference to the drawings will be omitted.

In this second embodiment, phenyltrimethoxysilane, silane and oxygen are used as source gases for formation of a silica insulation film by a plasma chemical vapor deposition method. Namely, instead of phenyltrimethylsilane, phenyltrimethoxysilane is used. The individual source gases are subjected to flow rate controls by a mass flow controller not illustrated for subsequent introductions thereof through the source gas introduction system 26 into the reaction chamber 21. Phenyltrimethoxysilane has a bonding structure of silicon to benzene nucleus. Phenyltrimethoxysilane is reacted with an oxidant to form a silica film including benzene nucleuses. Phenyltrimethoxysilane is in a liquid state at room temperature. Phenyltrimethoxysilane in liquid state is first filled in a stainless cylinder for vacuuming the stainless cylinder and subsequent heating the stainless cylinder. The source gas introduction system 26 including the mass flow controller and the reaction chamber 21 are also heated for prevention of condensation of phenyltrimethoxysilane so as to allow phenyltrimethoxysilane in gas state to be fed through the source gas introduction system 26 into the reaction chamber 21. Silane and oxygen are also fed through the source gas introduction system 26 into the reaction chamber 21.

The silicon substrate 24 comprises a silicon wafer covered by an aluminum layer and is placed on the bottom electrode 23. The parallel-plate plasma chemical vapor deposition is carried out under the following conditions. A flow rate of silane is varied in the range of 0 sccm to 50 sccm. A flow rate of phenyltrimethoxysilane is also varied in the range of 0 sccm to 50 sccm. A flow rate of oxygen is set 100 sccm. A pressure is set 0.1 Torr. A high frequency power of 500 W is applied to the top electrode 22. The substrate temperature is maintained at 300° C.

A measurement of an infrared absorption spectrum is made in order to confirm whether or not the silane insulation film does include benzene nucleuses. FIG. 2 is a diagram illustrative of measured infrared absorption spectrum of the silica film over wave number when the silica film is deposited under conditions of a silane flow rate of zero and a phenyltrimethoxysilane flow rate of 50 sccm. Absorption lines appear at wave numbers of about 1450 cm$^{-1}$, 1500 cm$^{-1}$ and 1600 cm$^{-1}$. Those absorption lines show absorptions of infrared ray due to the benzene nucleuses. No hydrocarbon composition other than benzene nucleus could be detected. The above matters show that if phenyltrimethoxysilane having a bonding structure of silicon with benzene nucleuses is used as a source gas for the plasma chemical vapor deposition method, then the silica film having the benzene nucleuses is formed. In accordance with the above infrared absorption spectrum, no Si—OH bonding due to moisture in the silica film is detected. This means that the silica film is free of residual moisture.

Further, the flow rates of phenyltrimethoxysilane and silane are changed for the further plasma chemical vapor depositions of the other silica films so that compositions of the silica film and dielectric constants thereof are measured. For measuring each of the dielectric constants of the silica films, an additional electrode is provided on the silica film having the benzene nucleuses so that a capacity between the additional electrode and the substrate is measured. From the above analysis of the compositions of the silica film, it could be understood that if only silane is used for the plasma chemical vapor deposition, then the silica film includes no benzene nucleuses. If a flow rate ratio of phenyltrimethoxysilane having a bonding structure of silicon with benzene nucleus is increased, then a carbon content of the silica film is also increased. This means that if the flow rate ratio of phenyltrimethoxysilane having the bonding structure of silicon with benzene nucleus is increased, then an amount of benzene nucleus in the silica film is also increased. If only phenyltrimethoxysilane is used without use of silane for the plasma chemical vapor deposition, then the silica film has a carbon content of about 30 at %. As a result of measuring the dielectric constant of the silica film, it is also understood that if the carbon content of the silica film is increased, then the dielectric constant of the silica film is decreased. For example, if silane only is used, then the silica film has a dielectric constant of $\in$ r=4 which almost corresponds to the dielectric constant of silica. The increase in flow rate ratio of phenyltrimethoxysilane to silane results in a decrease in dielectric constant of the silica film. If phenyltrimethoxysilane only is used for the plasma chemical vapor deposition, then the silica film has a dielectric constant of $\in$ r=3.

The above experimental results show that it is possible to form the silica film including the benzene nucleuses by use of phenyltrimethoxysilane having a bonding structure of silicon with benzene nucleuses as the source gas. It is also possible to control the content of benzene nucleuses in the silica film by controlling the amount of phenyltrimethoxysilane. Namely, the increase in the amount of phenyltrimethoxysilane results in an increase in amount of the benzene nucleuses in the silica film, whereby the dielectric constant of the silica film is decreased. If phenyltrimethoxysilane is used alone for the plasma chemical vapor deposition, then the carbon content of the silica film is about 30 at % and the dielectric constant thereof is about $\in$ r=3. Further, phenyltrimethoxysilane in a gas state is fed to the reaction chamber for subsequent plasma chemical vapor deposition, for which reason it is possible to form the silica film including the benzene nucleuses free of substantive residual impurity, particularly residual moisture. Furthermore, the benzene nucleuses with strong bonding in the silica film are stable among organic polymers to provide the silica film with a stability at high temperature.

In this embodiment, the plasma chemical vapor deposition was carried out by use of the parallel-plate plasma chemical vapor deposition apparatus. Notwithstanding, any other plasma chemical vapor deposition methods are also available. For example, it was confirmed that, for forming the silica film including the benzene nucleuses by use of phenyltrimethoxysilane, there are available an electron cyclotron resonance plasma chemical vapor deposition method, a helicon wave plasma chemical vapor deposition method, and an inductive coupled plasma chemical vapor deposition method.

Figure 3:
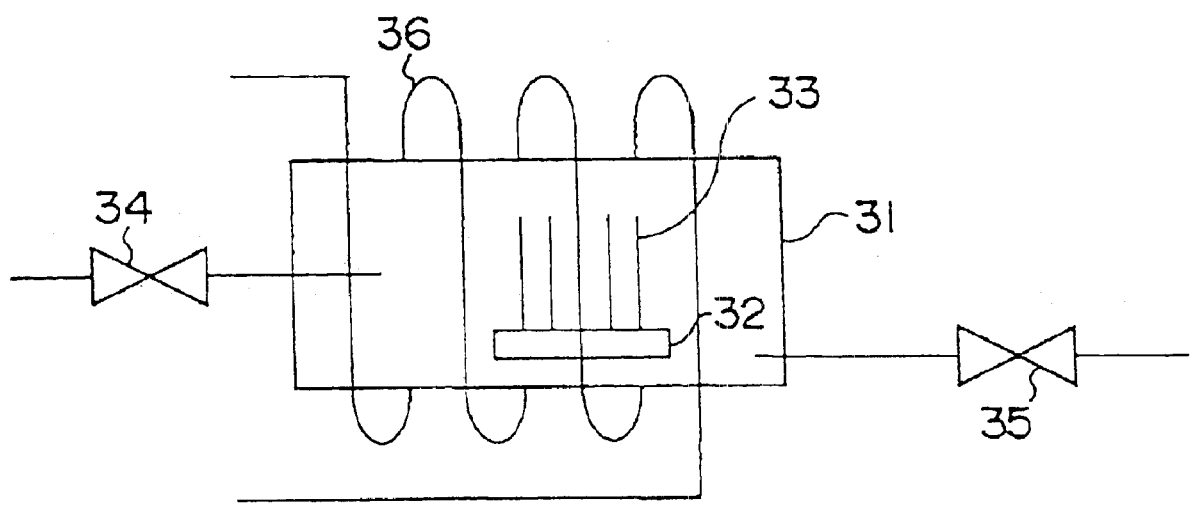
FIG. 3 is a schematic view illustrative of a low pressure chemical vapor deposition system used in accordance with the present invention.

Third Embodiment:

A third embodiment according to the present invention will be described in detail, wherein there is provided a method of forming a silica film including benzene nucleuses with a reduced dielectric constant over a silicon substrate by a chemical vapor deposition method. FIG. 3 is a schematic view illustrative of a low pressure chemical vapor deposition system used in this third embodiment in accordance with the present invention. The low pressure chemical vapor deposition system has a quartz reaction chamber 31 which accommodates a substrate holder 32 on which substrates 33 are placed. Further a heater 36 provided around the quartz reaction chamber 31 for heating the quartz reaction chamber 31. The quartz reaction chamber 31 is connected to a source gas introduction system 34 through which source gases are fed into the quartz reaction chamber 31. The quartz reaction chamber 31 is further connected to a gas discharge system 35 by which used gases are discharged from the quartz reaction chamber 31.

In this third embodiment, phenyltrimethylsilane, silane and oxygen are used as source gases for formation of a silica insulation film by a low pressure chemical vapor deposition method. The individual source gases are subjected to flow rate controls by a mass flow controller not illustrated for subsequent introductions thereof through the source gas introduction system 34 into the quartz reaction chamber 31. Phenyltrimethylsilane has a bonding structure of silicon to benzene nucleus. Phenyltrimethylsilane is reacted with an oxidant to form a silica film including benzene nucleuses. Phenyltrimethylsilane is in a liquid state at room temperature. Phenyltrimethylsilane has a boiling point of 169° C. Phenyltrimethylsilane in liquid state is first filled in a stainless cylinder for vacuuming the stainless cylinder and subsequent heating the stainless cylinder. The source gas introduction system 34 including the mass flow controller and the quartz reaction chamber 31 are also heated for prevention of condensation of phenyltrimethylsilane so as to allow phenyltrimethylsilane in gas state to be fed through the source gas introduction system 34 into the quartz reaction chamber 31. Silane and oxygen are also fed through the source gas introduction system 34 into the quartz reaction chamber 31.

Each of the silicon substrates 33 comprises a silicon wafer covered by an aluminum layer and is placed on the substrate holder 32. The low pressure chemical vapor deposition is carried out under the following conditions. A flow rate of silane is varied in the range of 0 sccm to 50 sccm. A flow rate of phenyltrimethylsilane is also varied in the range of 0 sccm to 50 sccm. A flow rate of oxygen is set 100 sccm. A pressure is set 0.5 Torr. A reaction tube temperature adjacent to the sample is maintained at 500° C. The substrate temperature is maintained at 300° C.

A measurement of an infrared absorption spectrum is made in order to confirm whether or not the silane insulation film does include benzene nucleuses. Absorption lines appear at wave numbers of about 1450 cm$^{-1}$, 1500 cm$^{-1}$ and 1600 cm$^{-1}$. Those absorption lines show absorptions of infrared ray due to the benzene nucleuses. No hydrocarbon composition other than benzene nucleus could be detected. The above matters show that if phenyltrimethylsilane having a bonding structure of silicon with benzene nucleuses is used as a source gas for the low pressure chemical vapor deposition method, then the silica film having the benzene nucleuses is formed. In accordance with the above infrared absorption spectrum, no Si—OH bonding due to moisture in the silica film is detected. This means that the silica film is free of residual moisture.

Further, the flow rates of phenyltrimethylsilane and silane are changed for the further low pressure chemical vapor depositions of the other silica films so that compositions of the silica film and dielectric constants thereof are measured. For measuring each of the dielectric constants of the silica films, an additional electrode is provided on the silica film having the benzene nucleuses so that a capacity between the additional electrode and the substrate is measured. From the above analysis of the compositions of the silica film, it could be understood that if only silane is used for the low pressure chemical vapor deposition, then the silica film includes no benzene nucleuses. If a flow rate ratio of phenyltrimethylsilane having a bonding structure of silicon with benzene nucleus is increased, then a carbon content of the silica film is also increased. This means that if the flow rate ratio of phenyltrimethylsilane having the bonding structure of silicon with benzene nucleus is increased, then an amount of benzene nucleus in the silica film is also increased. If only phenyltrimethylsilane is used without use of silane for the low pressure chemical vapor deposition, then the silica film has a carbon content of about 30 at %. As a result of measuring the dielectric constant of the silica film, it is also understood that if the carbon content of the silica film is increased, then the dielectric constant of the silica film is decreased. For example, if silane only is used, then the silica film has a dielectric constant of $\in r=4$ which almost corresponds to the dielectric constant of silica. The increase in flow rate ratio of phenyltrimethylsilane to silane results in a decrease in dielectric constant of the silica film. If phenyltrimethylsilane only is used for the low pressure chemical vapor deposition, then the silica film has a dielectric constant of $\in r=3$.

The above experimental results show that it is possible to form the silica film including the benzene nucleuses by use of phenyltrimethylsilane having a bonding structure of silicon with benzene nucleuses as the source gas. It is also possible to control the content of benzene nucleuses in the silica film by controlling the amount of phenyltrimethylsilane. Namely, the increase in the amount of phenyltrimethylsilane results in an increase in amount of the benzene nucleuses in the silica film, whereby the dielectric constant of the silica film is decreased. If phenyltrimethylsilane is used alone for the low pressure chemical vapor deposition, then the carbon content of the silica film is about 30 at % and the dielectric constant thereof is about $\in r=3$. Further, phenyltrimethylsilane in a gas state is fed to the reaction chamber for subsequent low pressure chemical vapor deposition, for which reason it is possible to form the silica film including the benzene nucleuses free of substantive residual impurity, particularly residual moisture. Furthermore, the benzene nucleuses with strong bonding in the silica film are stable among organic polymers to provide the silica film with a stability at high temperature.

In this embodiment, a single substrate is treated in the single low pressure chemical vapor deposition process. Notwithstanding, it is also possible that a plurality of substrates are treated in the single low pressure chemical vapor deposition process. It was confirmed that the batch-process of the low pressure chemical vapor deposition of a plurality of substrates provides substantially the same silica films as when the single wafer low pressure chemical vapor deposition process is carried out.

Fourth Embodiment:

A fourth embodiment according to the present invention will be described in detail, wherein there is provided a method of forming a silica film including benzene nucleuses with a reduced dielectric constant over a silicon substrate by a chemical vapor deposition method. The same low pressure chemical vapor deposition system as in the third embodiment and illustrated in FIG. 3 is used. The detailed descriptions thereof will be omitted.

In this fourth embodiment, instead of phenyltrimethylsilane, phenyltrimethoxysilane is used. Namely, phenyltrimethoxysilane, silane and oxygen are used as source gases for formation of a silica insulation film by a low pressure chemical vapor deposition method. The individual source gases are subjected to flow rate controls by a mass flow controller not illustrated for subsequent introductions thereof through the source gas introduction system 34 into the quartz reaction chamber 31. Phenyltrimethoxysilane has a bonding structure of silicon to benzene nucleus. Phenyltrimethoxysilane is reacted with an oxidant to form a silica film including benzene nucleuses. Phenyltrimethoxysilane is in a liquid state at room temperature. Phenyltrimethoxysilane has a boiling point of 169° C. Phenyltrimethoxysilane in liquid state is first filled in a stainless cylinder for vacuuming the stainless cylinder and subsequent heating the stainless cylinder. The source gas introduction system 34 including the mass flow controller and the quartz reaction chamber 31 are also heated for prevention of condensation of phenyltrimethoxysilane so as to allow phenyltrimethoxysilane in gas state to be fed through the source gas introduction system 34 into the quartz reaction chamber 31. Silane and oxygen are also fed through the source gas introduction system 34 into the quartz reaction chamber 31.

Each of the silicon substrates 33 comprises a silicon wafer covered by an aluminum layer and is placed on the substrate holder 32. The low pressure chemical vapor deposition is carried out under the following conditions. A flow rate of silane is varied in the range of 0 sccm to 50 sccm. A flow rate of phenyltrimethoxysilane is also varied in the range of 0 sccm to 50 sccm. A flow rate of oxygen is set 100 sccm. A pressure is set 0.5 Torr. A reaction tube temperature adjacent to the sample is maintained at 500° C. The substrate temperature is maintained at 300° C.

A measurement of an infrared absorption spectrum is made in order to confirm whether or not the silane insulation film does include benzene nucleuses. Absorption lines appear at wave numbers of about 1450 cm$^{-1}$, 1500 cm$^{-1}$ and 1600 cm$^{-1}$. Those absorption lines show absorptions of infrared ray due to the benzene nucleuses. No hydrocarbon composition other than benzene nucleus could be detected. The above matters show that if phenyltrimethoxysilane having a bonding structure of silicon with benzene nucleuses is used as a source gas for the low pressure chemical vapor deposition method, then the silica film having the benzene nucleuses is formed. In accordance with the above infrared absorption spectrum, no Si—OH bonding due to moisture in the silica film is detected. This means that the silica film is free of residual moisture.

Further, the flow rates of phenyltrimethoxysilane and silane are changed for the further low pressure chemical vapor depositions of the other silica films so that compositions of the silica film and dielectric constants thereof are measured. For measuring each of the dielectric constants of the silica films, an additional electrode is provided on the silica film having the benzene nucleuses so that a capacity between the additional electrode and the substrate is measured. From the above analysis of the compositions of the silica film, it could be understood that if only silane is used for the low pressure chemical vapor deposition, then the silica film includes no benzene nucleuses. If a flow rate ratio of phenyltrimethoxysilane having a bonding structure of silicon with benzene nucleus is increased, then a carbon content of the silica film is also increased. This means that If the flow rate ratio of phenyltrimethoxysilane having the bonding structure of silicon with benzene nucleus is increased, then an amount of benzene nucleus in the silica film is also increased. If only phenyltrimethoxysilane is used without use of silane for the low pressure chemical vapor deposition, then the silica film has a carbon content of about 30 at %. As a result of measuring the dielectric constant of the silica film, it is also understood that if the carbon content of the silica film is increased, then the dielectric constant of the silica film is decreased. For example, if silane only is used, then the silica film has a dielectric constant of ∈ r=4 which almost corresponds to the dielectric constant of silica. The increase in flow rate ratio of phenyltrimethoxysilane to silane results in a decrease in dielectric constant of the silica film. If phenyltrimethoxysilane only is used for the low pressure chemical vapor deposition, then the silica film has a dielectric constant of ∈ r=3.

The above experimental results show that it is possible to form the silica film including the benzene nucleuses by use of phenyltrimethoxysilane having a bonding structure of silicon with benzene nucleuses as the source gas. It is also possible to control the content of benzene nucleuses in the silica film by controlling the amount of phenyltrimethoxysilane. Namely, the increase in the amount of phenyltrimethoxysilane results in an increase in amount of the benzene nucleuses in the silica film, whereby the dielectric constant of the silica film is decreased. If phenyltrimethoxysilane is used alone for the low pressure chemical vapor deposition, then the carbon content of the silica film is about 30 at % and the dielectric constant thereof is about ∈ r=3. Further, phenyltrimethoxysilane in a gas state is fed to the reaction chamber for subsequent low pressure chemical vapor deposition, for which reason it is possible to form the silica film including the benzene nucleuses free of substantive residual impurity, particularly residual moisture. Furthermore, the benzene nucleuses with strong bonding in the silica film are stable among organic polymers to provide the silica film with a stability at high temperature.

In this embodiment, a single substrate is treated in the single low pressure chemical vapor deposition process. Notwithstanding, it is also possible that a plurality of substrates are treated in the single low pressure chemical vapor deposition process. It was confirmed that the batch-process of the low pressure chemical vapor deposition of a plurality of substrates provides substantially the same silica films as when the single wafer low pressure chemical vapor deposition process is carried out.

Fifth Embodiment:

A fifth embodiment according to the present invention will be described in detail, wherein there is provided a method of forming a silica film including benzene nucleuses with a reduced dielectric constant over a silicon substrate by a chemical vapor deposition method. The same parallel-plate plasma chemical vapor deposition system as used in the first embodiment and illustrated in FIG. 1 is used. Detailed descriptions thereof will be omitted.

In this fifth embodiment, instead of phenyltrimethylsilane, toluene is used. Namely, toluene, silane and oxygen are used as source gases for formation of a silica insulation film by a plasma chemical vapor deposition method. The individual source gases are subjected to flow rate controls by a mass flow controller not illustrated for subsequent introductions thereof through the source gas introduction system 26 into the reaction chamber 21. Toluene is an aromatic compound with benzene ring free of a bonding structure of silicon to benzene nucleus. Toluene is reacted with an oxidant with a silicon source gas to form a silica film including benzene nucleuses. Toluene is in a liquid state at room temperature. Toluene in liquid state is first filled in a stainless cylinder for vacuuming the stainless cylinder and subsequent heating the stainless cylinder up to about 50° C. The source gas introduction system 26 including the mass flow controller and the reaction chamber 21 are also heated up to about 100° C. for prevention of condensation of toluene so as to allow toluene in gas state to be fed through the source gas introduction system 26 into the reaction chamber 21. Silane and oxygen are also fed through the source gas introduction system 26 into the reaction chamber 21.

The silicon substrate 24 comprises a silicon wafer covered by an aluminum layer and is placed on the bottom electrode 23. The parallel-plate plasma chemical vapor deposition is carried out under the following conditions. A flow rate of silane is varied in the range of 10 sccm to 50 sccm. A flow rate of toluene is also varied in the range of 0 sccm to 10 sccm. A flow rate of oxygen is set 100 sccm. A pressure is set 0.1 Torr. A high frequency power of 500 W is applied to the top electrode 22. The substrate temperature is maintained at 300° C.

A measurement of an infrared absorption spectrum is made in order to confirm whether or not the silane insulation film does include benzene nucleuses. As a result of the measurement of the infrared absorption spectrum, it was confirmed that absorption lines appear which show absorptions of infrared ray due to the benzene nucleuses. No hydrocarbon composition other than benzene nucleus could be detected. The above matters show that if toluene as an aromatic compound with benzene nucleus free of a bonding structure of silicon with benzene nucleus is used as a source gas for the plasma chemical vapor deposition method, then the silica film having the benzene nucleuses is formed. In accordance with the above infrared absorption spectrum, no Si—OH bonding due to moisture in the silica film is detected. This means that the silica film is free of residual moisture.

Further, the flow rates of toluene and silane are changed for the further plasma chemical vapor depositions of the other silica films so that compositions of the silica film and dielectric constants thereof are measured. For measuring each of the dielectric constants of the silica films, an additional electrode is provided on the silica film having the benzene nucleuses so that a capacity between the additional electrode and the substrate is measured. From the above analysis of the compositions of the silica film, it could be understood that if only silane is used for the plasma chemical vapor deposition, then the silica film includes no benzene nucleuses. If a flow rate ratio of toluene with benzene nucleus free of a bonding structure of silicon with benzene nucleus is increased, then a carbon content of the silica film is also increased. This means that if the flow rate ratio of toluene having the bonding structure of silicon with benzene nucleus is increased, then an amount of benzene nucleus in the silica film is also increased. If a flow rate of toluene is the same as a flow rate of silane for the plasma chemical vapor deposition, then the silica film has a carbon content of about 30 at %. As a result of measuring the dielectric constant of the silica film, it is also understood that if the carbon content of the silica film is increased, then the dielectric constant of the silica film is decreased. For example, if silane only is used, then the silica film has a dielectric constant of ∈ r=4 which almost corresponds to the dielectric constant of silica. The increase in flow rate ratio of toluene to silane results in a decrease in dielectric constant of the silica film. If a flow rate of toluene is the same as a flow rate of silane for the plasma chemical vapor deposition, then the silica film has a dielectric constant of ∈ r=3.

The above experimental results show that it is possible to form the silica film including the benzene nucleuses by use of toluene with benzene nucleus free of a bonding structure of silicon with benzene nucleuses as the benzene nucleus source gas together with the silicon source gas, for example, silane. It is also possible to control the content of benzene nucleuses in the silica film by controlling the amount of toluene. Namely, the increase in the amount of toluene results in an increase in amount of the benzene nucleuses in the silica film, whereby the dielectric constant of the silica film is decreased. If the flow rate of the toluene is set at the same as the silane, then the carbon content of the silica film is about 30 at % and the dielectric constant thereof is about ∈ r=3. Further, toluene in a gas state is fed to the reaction chamber for subsequent plasma chemical vapor deposition, for which reason it is possible to form the silica film including the benzene nucleuses free of substantive residual impurity, particularly residual moisture. Furthermore, the benzene nucleuses with strong bonding in the silica film are stable among organic polymers to provide the silica film with a stability at high temperature.

As a modification to this embodiment, it is also available to use the aromatic compound with benzene nucleus free of a bonding structure of silicon with benzene nucleus, for example, toluene in combination with organic polymers having the benzene nucleuses with the bonding structure of silicon with benzene nucleus, for example, phenyltrimethylsilane or phenyltrimethoxysilane. In this case, it is possible to increase the carbon content of the silica film up to over 30 at % and also reduce the dielectric constant thereof down to under ∈ r=3. In view of keeping a high stability at high temperature of the silica film, it might be better to suppress the carbon content of the silica film within 30 at % because an excess carbon content of the silica film might result in difficulty to keep the high stability at high temperature even the benzene nucleus is relatively stable due to its strong bridge bonding structure.

In this embodiment, toluene is used as the benzene nucleus source material due to a relatively low boiling point for easy feeding thereof to the reaction chamber. Nevertheless, the other aromatic compounds with benzene nucleus free of the bonding structure of silicon with benzene nucleus are also available such as benzene and xylene. Further, the other aromatic compounds are available which have a structure of a plurality of benzene nucleuses free of the bonding structure of silicon with benzene nucleus, for example, naphthalene, biphenyl and anthracene.

Moreover, in this embodiment, the plasma chemical vapor deposition was carried out by use of the parallel-plate plasma chemical vapor deposition apparatus. Notwithstanding, any other plasma chemical vapor deposition methods are also available. For example, it was confirmed that, for forming the silica film including the benzene nucleuses by use of toluene, there are available an electron cyclotron resonance plasma chemical vapor deposition method, a helicon wave plasma chemical vapor deposition method, and an inductive coupled plasma chemical vapor deposition method.

Sixth Embodiment:

A sixth embodiment according to the present invention will be described in detail, wherein there is provided a method of forming a silica film including benzene nucleuses with a reduced dielectric constant over a silicon substrate by a chemical vapor deposition method. The same low pressure chemical vapor deposition system as used in the third embodiment and illustrated in FIG. 3 is used. Detailed descriptions thereof will be omitted.

In this sixth embodiment, instead of phenyltrimethylsilane, toluene is used. Namely, toluene, silane and oxygen are used as source gases for formation of a silica insulation film by a low pressure chemical vapor deposition method. The individual source gases are subjected to flow rate controls by a mass flow controller not illustrated for subsequent introductions thereof through the source gas introduction system 34 into the reaction chamber 31. Toluene is an aromatic compound with benzene ring free of a bonding structure of silicon to benzene nucleus. Toluene is reacted with an oxidant with a silicon source gas to form a silica film including benzene nucleuses. Toluene is in a liquid state at room temperature. Toluene in liquid state is first filled in a stainless cylinder for vacuuming the stainless cylinder and subsequent heating the stainless cylinder. The source gas introduction system 34 including the mass flow controller and the reaction chamber 31 are also heated for prevention of condensation of toluene so as to allow toluene in gas state to be fed through the source gas introduction system 34 into the reaction chamber 21. Silane and oxygen are also fed through the source gas introduction system 34 into the reaction chamber 31.

Each of the silicon substrates 33 comprises a silicon wafer covered by an aluminum layer and is placed on the substrate holder 32. The low pressure chemical vapor deposition is carried out under the following conditions. A flow rate of silane is varied in the range of 10 sccm to 50 sccm. A flow rate of toluene is also varied in the range of 0 sccm to 10 sccm. A flow rate of oxygen is set 100 sccm. A pressure is set 0.5 Torr. The substrate temperature is maintained at 300° C.

A measurement of an infrared absorption spectrum is made in order to confirm whether or not the silane insulation film does include benzene nucleuses. As a result of the measurement of the infrared absorption spectrum, it was confirmed that absorption lines appear which show absorptions of infrared ray due to the benzene nucleuses. No hydrocarbon composition other than benzene nucleus could be detected. The above matters show that if toluene as an aromatic compound with benzene nucleus free of a bonding structure of silicon with benzene nucleus is used as a source gas for the low pressure chemical vapor deposition method, then the silica film having the benzene nucleuses is formed. In accordance with the above infrared absorption spectrum, no Si—OH bonding due to moisture in the silica film is detected. This means that the silica film is free of residual moisture.

Further, the flow rates of toluene and silane are changed for the further low pressure chemical vapor depositions of the other silica films so that compositions of the silica film and dielectric constants thereof are measured. For measuring each of the dielectric constants of the silica films, an additional electrode is provided on the silica film having the benzene nucleuses so that a capacity between the additional electrode and the substrate is measured. From the above analysis of the compositions of the silica film, it could be understood that if only silane is used for the low pressure chemical vapor deposition, then the silica film includes no benzene nucleuses. If a flow rate ratio of toluene with benzene nucleus free of a bonding structure of silicon with benzene nucleus is increased, then a carbon content of the silica film is also increased. This means that if the flow rate ratio of toluene having the bonding structure of silicon with benzene nucleus is increased, then an amount of benzene nucleus in the silica film is also increased. If a flow rate of toluene is the same as a flow rate of silane for the low pressure chemical vapor deposition, then the silica film has a carbon content of about 30 at %. As a result of measuring the dielectric constant of the silica film, it is also understood that if the carbon content of the silica film is increased, then the dielectric constant of the silica film is decreased. For example, if silane only is used, then the silica film has a dielectric constant of $\in$ r=4 which almost corresponds to the dielectric constant of silica. The increase in flow rate ratio of toluene to silane results in a decrease in dielectric constant of the silica film. If a flow rate of toluene is the same as a flow rate of silane for the low pressure chemical vapor deposition, then the silica film has a dielectric constant of $\in$ r=3.

The above experimental results show that it is possible to form the silica film including the benzene nucleuses by use of toluene with benzene nucleus free of a bonding structure of silicon with benzene nucleuses as the benzene nucleus source gas together with the silicon source gas, for example, silane. It is also possible to control the content of benzene nucleuses in the silica film by controlling the amount of toluene. Namely, the increase in the amount of toluene results in an increase in amount of the benzene nucleuses in the silica film, whereby the dielectric constant of the silica film is decreased. If the flow rate of the toluene is set at the same as the silane, then the carbon content of the silica film is about 30 at % and the dielectric constant thereof is about $\in$ r=3. Further, toluene in a gas state is fed to the reaction chamber for subsequent low pressure chemical vapor deposition, for which reason it is possible to form the silica film including the benzene nucleuses free of substantive residual impurity, particularly residual moisture. Furthermore, the benzene nucleuses with strong bonding in the silica film are stable among organic polymers to provide the silica film with a stability at high temperature.

As a modification to this embodiment, it is also available to use the aromatic compound with benzene nucleus free of a bonding structure of silicon with benzene nucleus, for example, toluene in combination with organic polymers having the benzene nucleuses with the bonding structure of silicon with benzene nucleus, for example, phenyltrimethylsilane or phenyltrimethoxysilane. In this case, it is possible to increase the carbon content of the silica film up to over 30 at % and also reduce the dielectric constant thereof down to under $\in$ r=3. In view of keeping a high stability at high temperature of the silica film, it might be better to suppress the carbon content of the silica film within 30 at % because an excess carbon content of the silica film might result in difficulty to keep the high stability at high temperature even the benzene nucleus is relatively stable due to its strong bridge bonding structure.

In this embodiment, toluene is used as the benzene nucleus source material due to a relatively low boiling point for easy feeding thereof to the reaction chamber. Nevertheless, the other aromatic compounds with benzene nucleus free of the bonding structure of silicon with benzene nucleus are also available such as benzene and xylene. Further, the other aromatic compounds are available which have a structure of a plurality of benzene nucleuses free of the bonding structure of silicon with benzene nucleus, for example, naphthalene, biphenyl and anthracene.

Seventh Embodiment:

A seventh embodiment according to the present invention will be described in detail, wherein there is provided a method of forming a silica film including pores which have been formed by elimination of benzene nucleuses from the silica film which had been formed in the same chemical vapor deposition method as in the first embodiment. The silica film including pores has a lower dielectric constant than the silica film having the benzene nucleuses. The same parallel-plate plasma chemical vapor deposition system as used in the first embodiment is also used in this embodiment. Detailed descriptions thereof will be omitted.

In this seventh embodiment, phenyltrimethylsilane and oxygen are used as source gases for formation of a silica insulation film by a plasma chemical vapor deposition method. The individual source gases are subjected to flow rate controls by a mass flow controller not illustrated for subsequent introductions thereof through the source gas introduction system 26 into the reaction chamber 21. Phenyltrimethylsilane has a bonding structure of silicon to benzene nucleus. Phenyltrimethylsilane is reacted with an oxidant to form a silica film including benzene nucleuses. Phenyltrimethylsilane is in a liquid state at room temperature. Phenyltrimethylsilane has a boiling point of 169° C. Phenyltrimethylsilane in liquid state is first filled in a stainless cylinder for vacuuming the stainless cylinder and subsequent heating the stainless cylinder up to about 100° C. The source gas introduction system 26 including the mass flow controller and the reaction chamber 21 are also heated up to about 150° C. for prevention of condensation of phenyltrimethylsilane so as to allow phenyltrimethylsilane in gas state to be fed through the source gas introduction system 26 into the reaction chamber 21. Oxygen is also fed through the source gas introduction system 26 into the reaction chamber 21.

The silicon substrate 24 comprises a silicon wafer covered by a copper layer and is placed on the bottom electrode 23. The parallel-plate plasma chemical vapor deposition is carried out under the following conditions. A flow rate of phenyltrimethylsilane is set at 50 sccm. A flow rate of oxygen is set 100 sccm. A pressure is set 0.1 Torr. A high frequency power of 500 W is applied to the top electrode 22. The substrate temperature is maintained at 300° C.

As a result of the above plasma chemical vapor deposition, the silica film including the benzene nucleuses is formed over the substrate. Since the conditions for this plasma chemical vapor deposition method are the same as in the first embodiment to obtain the silica film having a carbon content of about 30 at % and a dielectric constant of $\in$ r=3, then the silica film which is formed in this embodiment is also expected to have a carbon content of about 30 at % and a dielectric constant of $\in$ r=3. Following to the above plasma chemical vapor deposition of the silica film including the benzene nucleuses, the silica film is then subjected to a heat treatment or an anneal in a vacuum for causing an elimination reaction of benzene nucleuses from the silica film. The temperature is increased with monitoring components eliminated from the silica film. It was confirmed that the elimination reaction of benzene nucleuses from the silica film is initiated at a temperature of about 450° C. In this embodiment, the temperature was increased to and kept at 500° C. so that only benzene nucleuses are selectively eliminated from the silica film but no elimination of other components than benzene nucleuses from the silica film could be observed. The selective elimination of the benzene nucleuses from the silica film results in formation of a porous silica film. Namely, the silica film includes many pores which have been formed by the elimination of the benzene nucleuses from the silica film.

A measurement of a dielectric constant of the silica film was made. It was confirmed that the silica film including many pores has a dielectric constant of $\in$ r=2.5 which is lower than the silica films having the benzene nucleuses formed in the foregoing embodiments. This means that the elimination of the benzene nucleuses from the silica film to form the many pores in the silica film results in a further reduction in dielectric constant of the silica film. A density of the porous silica film is lower than a density of the silica film including the benzene nucleuses. It may be considered that the reduction in density of the silica film results in drop of the dielectric constant thereof. The elimination of benzene nucleuses from the silica film to form the porous silica film results in the reductions in dielectric constant and density of the silica film. It was confirmed that properties other than density, dielectric constant and refractive index of the silica film substantially remain unchanged by the elimination of benzene nucleuses. It was further confirmed that the properties of the porous silica formed by the elimination of the benzene nucleuses also remain unchanged by a heat treatment of at least not higher than 600° C.

As a modification to this embodiment, it is possible to carry out the anneal in an inert gas atmosphere such as an argon atmosphere or a nitrogen atmosphere, instead of the vacuum, for the elimination of the benzene nucleuses.

As a further modification to this embodiment, it is also possible to use phenyltrimethoxysilane, instead of phenyltrimethylsilane, as the benzene nucleus source material. In place of the organic polymers having the benzene nucleus with a bonding structure of silicon with benzene nucleus such as phenyltrimethoxysilane and phenyltrimethylsilane, it is also possible to use, along with the silicon source gas, other organic polymers having the benzene nucleus free of a bonding structure of silicon with benzene nucleus, such as toluene, benzene, xylene, naphthalene, biphenyl and anthracene.

As a furthermore modification to this embodiment, it is also possible to carry out a low pressure chemical vapor deposition method, instead of the plasma chemical vapor deposition.

As moreover modification to this embodiment, it is also possible to remove the benzene nucleuses from the silica film by use of a combustion reaction in an oxygen atmosphere instead of the above elimination reaction.

Eighth Embodiment:

An eighth embodiment according to the present invention will be described in detail, wherein there is provided a method of forming a silica film including pores which have been formed by elimination of benzene nucleuses from the silica film during a high temperature plasma chemical vapor deposition method. The silica film including pores has a lower dielectric constant than the silica film having the benzene nucleuses. The same parallel-plate plasma chemical vapor deposition system as used in the first embodiment is also used in this embodiment. Detailed descriptions thereof will be omitted.

In this eighth embodiment, phenyltrimethylsilane and oxygen are used as source gases for formation of a silica insulation film by a plasma chemical vapor deposition method. The individual source gases are subjected to flow rate controls by a mass flow controller not illustrated for subsequent introductions thereof through the source gas introduction system 26 into the reaction chamber 21. Phenyltrimethylsilane has a bonding structure of silicon to benzene nucleus. Phenyltrimethylsilane is reacted with an oxidant to form a silica film including benzene nucleuses. Phenyltrimethylsilane is in a liquid state at room temperature. Phenyltrimethylsilane has a boiling point of 169° C. Phenyltrimethylsilane in liquid state is first filled in a stainless cylinder for vacuuming the stainless cylinder and subsequent heating the stainless cylinder up to about 100° C. The source gas introduction system 26 including the mass flow controller and the reaction chamber 21 are also heated for prevention of condensation of phenyltrimethylsilane so as to allow phenyltrimethylsilane in gas state to be fed through the source gas introduction system 26 into the reaction chamber 21. Oxygen is also fed through the source gas introduction system 26 into the reaction chamber 21.

The silicon substrate 24 comprises a silicon wafer covered by a copper layer and is placed on the bottom electrode 23. The parallel-plate plasma chemical vapor deposition is carried out under the following conditions. A flow rate of phenyltrimethylsilane is set at 50 sccm. A flow rate of oxygen is set 100 sccm. A pressure is set 0.1 Torr. A high frequency power of 500 W is applied to the top electrode 22. The substrate temperature is maintained at 500° C. so as to cause the elimination reaction of the benzene nucleuses in the chemical vapor deposition process. As described above in the seventh embodiment, the elimination reaction of the benzene nucleuses from the silica film is initiated at 450° C. The chemical vapor deposition by keeping the substrate temperature at about 500° C. causes the selective elimination reaction of the benzene nucleuses without any further elimination of other components than benzene nucleuses As a result of the above plasma chemical vapor deposition, the silica film including pores is formed over the substrate.

A measurement of a dielectric constant of the silica film was made. It was confirmed that the silica film including many pores has a dielectric constant of $\in$ r=2.5 which is lower than the silica films having the benzene nucleuses formed in the foregoing embodiments. This means that the elimination of the benzene nucleuses to form the many pores in the silica film results in a further reduction in dielectric constant of the silica film A density of the porous silica film is lower than a density of the silica film including the benzene nucleuses. It may be considered that the reduction in density of the silica film results in drop of the dielectric constant thereof. The elimination of benzene nucleuses at the same time when the silica film is formed by the chemical vapor deposition results in the reductions in dielectric constant and density of the silica film. It was confirmed that the properties of the porous silica film formed by the elimination of the benzene nucleuses during the chemical vapor deposition also remain unchanged by a heat treatment of at least not higher than 600° C.

As a modification to this embodiment, it is also possible to use phenyltrimethoxysilane, instead of phenyltrimethylsilane, as the benzene nucleus source material. In place of the organic polymers having the benzene nucleus with a bonding structure of silicon with benzene nucleus such as phenyltrimethoxysilane and phenyltrimethylsilane, it is also possible to use, along with the silicon source gas, other organic polymers having the benzene nucleus free of a bonding structure of silicon with benzene nucleus, such as toluene, benzene, xylene, naphthalene, biphenyl and anthracene.

As a further modification to this embodiment, it is also possible to carry out a low pressure chemical vapor deposition method, instead of the plasma chemical vapor deposition.

Figure 4:
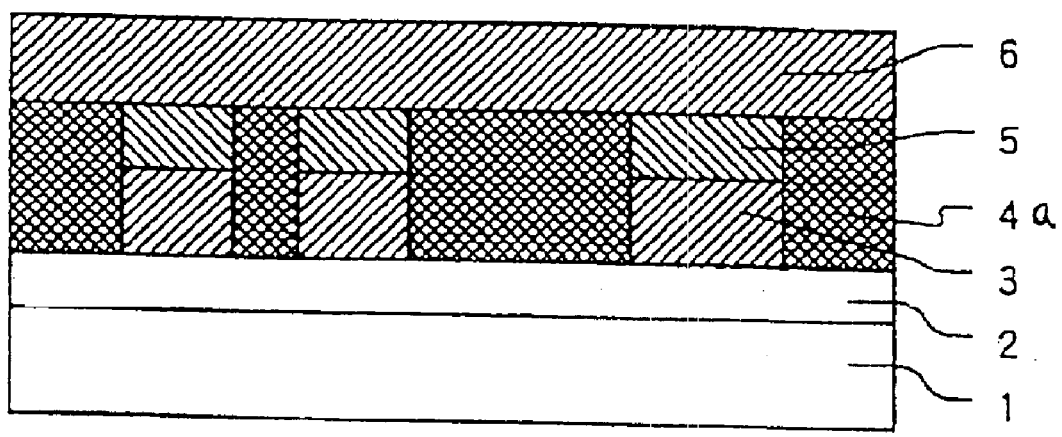
FIG. 4 is a fragmentary cross sectional elevation view illustrative of a semiconductor device with a multilevel interconnection structure which has a silica film including benzene nucleuses with a reduced dielectric constant in a ninth embodiment in accordance with the present invention.

Ninth Embodiment:

A ninth embodiment according to the present invention will be described in detail wherein there is provided a semiconductor device with a multi-level interconnection structure which has a silica inter-layer insulator including benzene nucleuses with a reduced dielectric constant formed by a chemical vapor deposition method. FIG. 4 is a fragmentary cross sectional elevation view illustrative of a semiconductor device with a multi-level interconnection structure which has a silica film including benzene nucleuses with a reduced dielectric constant.

A silicon substrate 1 has an active region. An insulation layer 2 made of phospho-silicate glass is provided which extends over the silicon substrate 1. First level interconnection layers 3 are provided over the insulation layer 2, wherein the first level interconnection layers 3 are electrically connected to the active region of the silicon substrate through contact holes formed in the insulation layer 2. The first level interconnection layers 3 are made of Al—Si—Cu alloy. The first level interconnection layers 3 have a minimum width of 0.25 micrometers and a uniform thickness of 0.7 micrometers. Via plugs 5 made of tungsten are provided on the first level interconnection layers 3. A silica inter-layer insulator 4a is provided over the insulation layer 2 except over the via plugs 5 and the first level interconnection layers 3. The silica inter-layer insulator 4a includes benzene nucleuses and has a lower dielectric constant than a dielectric constant of the normal silica insulation. The silica inter-layer insulator 4a has a thickness of 0.5 micrometers. Second level interconnection layers 6 are provided over the silica inter-layer insulator 4a, wherein the second level interconnection layers 6 are electrically connected to the first level interconnection layers 3 through the via plugs 5. The second level interconnection layers 6 are made of Al—Si—Cu alloy. The second level interconnection layers 6 have a minimum width of 0.25 micrometers and a uniform thickness of 0.7 micrometers.

A method of forming the above semiconductor device with the multi-level interconnection structure which has the silica inter-layer insulator including benzene nucleuses with a reduced dielectric constant will be described with reference to FIGS. 5A through 5H.

Figure 5A:
FIGS. 5A through 5H are fragmentary cross sectional elevation views illustrative of a method of forming a semiconductor device with a multi-level interconnection structure which has a silica inter-layer insulator including benzene nucleuses with a reduced dielectric constant in a ninth embodiment in accordance with the present invention.

With reference to FIG. 5A, a silicon substrate 1 is prepared, which has an active region not illustrated.

Figure 5B:
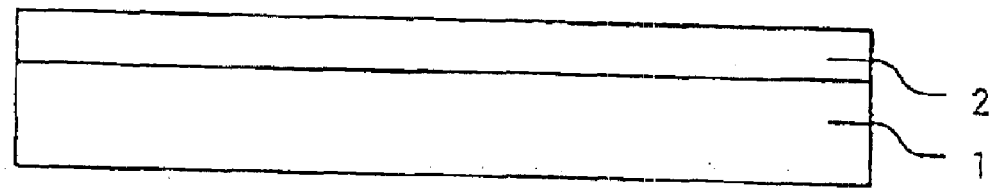

With reference to FIG. 5B, an insulation layer 2 made of phospho-silicate glass is formed over the silicon substrate 1 by the known method. Contact holes not illustrated are formed in the insulation layer 2. Contact metal layers are then formed within the contact holes.

Figure 5C:
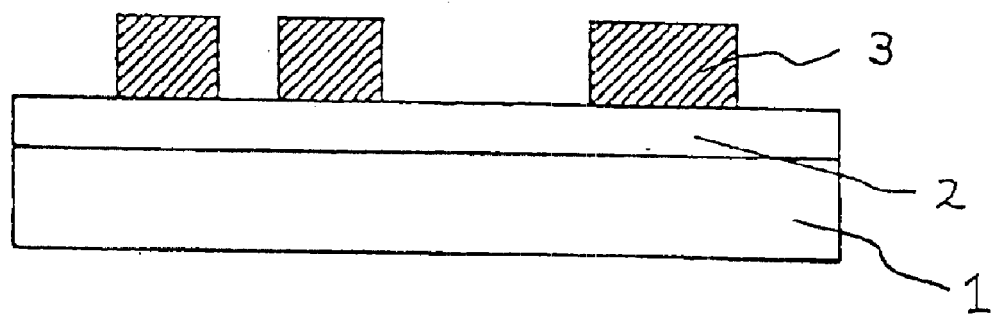

With reference to FIG. 5C, an Al—Si—Cu alloy layer is entirely deposited over the insulation layer 2 by a sputtering method so that the Al—Si—Cu alloy layer has a thickness of 0.7 micrometers. The Al—Si—Cu alloy layer is then patterned by a photo-lithography technique to form first level interconnection layers 3 over the insulation layer 2, wherein the first level interconnection layers 3 are in contact with the contact metal layers so that the first level interconnection layers 3 are electrically connected through the contact metal layers to the silicon substrate 1.

Figure 5D:
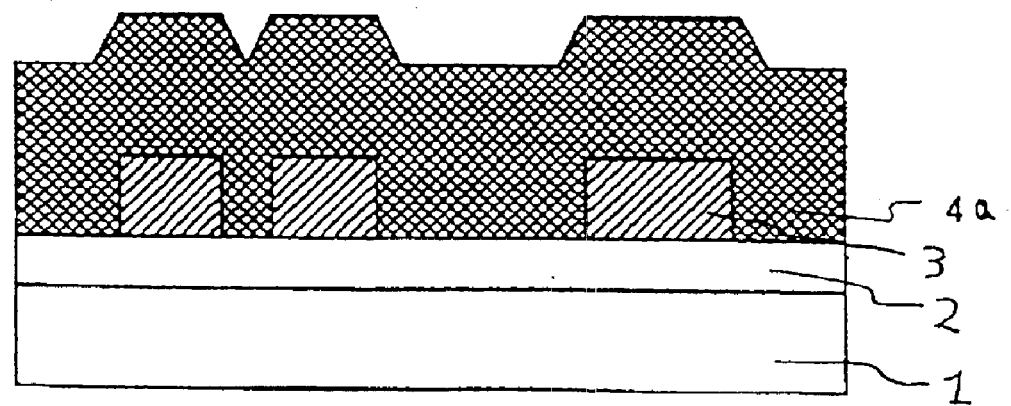

With reference to FIG. 5D, a silica inter-layer insulator 4a including benzene nucleuses is entirely deposited over the insulation layer 2 and the first level interconnection layers 3 by the same plasma chemical vapor deposition method as used in the first embodiment. The same parallel-plate plasma chemical vapor deposition system as used in the first embodiment is also used in this embodiment. Detailed descriptions thereof will be omitted.

In this embodiment, phenyltrimethylsilane, silane and oxygen are used as source gases for formation of a silica insulation film by a plasma chemical vapor deposition method. The individual source gases are subjected to flow rate controls by a mass flow controller not illustrated for subsequent introductions thereof through the source gas introduction system 26 into the reaction chamber 21. Phenyltrimethylsilane has a bonding structure of silicon to benzene nucleus. Phenyltrimethylsilane is reacted with an oxidant to form a silica inter-layer insulator including benzene nucleuses. Phenyltrimethylsilane is in a liquid state at room temperature. Phenyltrimethylsilane has a boiling point of 169° C. Phenyltrimethylsilane in liquid state is first filled in a stainless cylinder for vacuuming the stainless cylinder and subsequent heating the stainless cylinder up to about 100° C. The source gas introduction system 26 including the mass flow controller and the reaction chamber 21 are also heated up to about 150° C. for prevention of condensation of phenyltrimethylsilane so as to allow phenyltrimethylsilane in gas state to be fed through the source gas introduction system 26 into the reaction chamber 21. Silane and oxygen are also fed through the source gas introduction system 26 into the reaction chamber 21.

The parallel-plate plasma chemical vapor deposition is carried out under the following conditions. A flow rate of silane is varied in the range of 0 sccm to 50 sccm. A flow rate of phenyltrimethylsilane is also varied in the range of 0 sccm to 50 sccm. A flow rate of oxygen is set 100 sccm. A pressure is set 0.1 Torr. A high frequency power of 500 W is applied to the top electrode 22. The substrate temperature is maintained at 300° C.

Further, the flow rates of phenyltrimethylsilane and silane are changed for the further plasma chemical vapor depositions of the other silica inter-layer insulators 4 so that compositions of the silica inter-layer insulators 4 and dielectric constants thereof are measured. For measuring each of the dielectric constants of the silica inter-layer insulators 4, an additional electrode is provided on the silica inter-layer insulator 4a having the benzene nucleuses so that a capacity between the additional electrode and the substrate is measured. From the above analysis of the compositions of the silica inter-layer insulator 4a, it could be understood that if only silane is used for the plasma chemical vapor deposition, then the silica inter-layer insulator 4a includes no benzene nucleuses. If a flow rate ratio of phenyltrimethylsilane having a bonding structure of silicon with benzene nucleus is increased, then a carbon content of the silica inter-layer insulator 4a is also increased. This means that If the flow rate ratio of phenyltrimethylsilane having the bonding structure of silicon with benzene nucleus is increased, then an amount of benzene nucleus in the silica inter-layer insulator 4a is also increased. If only phenyltrimethylsilane is used without use of silane for the plasma chemical vapor deposition, then the silica inter-layer insulator 4a has a carbon content of about 30 at %. As a result of measuring the dielectric constant of the silica inter-layer insulator 4a, it is also understood that if the carbon content of the silica inter-layer insulator 4a is increased, then the dielectric constant of the silica inter-layer insulator 4a is decreased. For example, if silane only is used, then the silica inter-layer insulator 4a has a dielectric constant of ∈ r=4 which almost corresponds to the dielectric constant of silica. The increase in flow rate ratio of phenyltrimethylsilane to silane results in a decrease in dielectric constant of the silica inter-layer insulator 4a. If phenyltrimethylsilane only is used for the plasma chemical vapor deposition, then the silica inter-layer insulator 4a has a dielectric constant of ∈ r=3.

The above experimental results show that it is possible to form the silica inter-layer insulator 4a including the benzene nucleuses by use of phenyltrimethylsilane having a bonding structure of silicon with benzene nucleuses as the source gas. It is also possible to control the content of benzene nucleuses in the silica inter-layer insulator 4a by controlling the amount of phenyltrimethylsilane. Namely, the increase in the amount of phenyltrimethylsilane results in an increase in amount of the benzene nucleuses in the silica inter-layer insulator 4a, whereby the dielectric constant of the silica inter-layer insulator 4a is decreased. If phenyltrimethylsilane is used alone for the plasma chemical vapor deposition, then the carbon content of the silica inter-layer insulator 4a is about 30 at % and the dielectric constant thereof is about ∈ r=3. Further, phenyltrimethylsilane in a gas state is fed to the reaction chamber for subsequent plasma chemical vapor deposition, for which reason it is possible to form the silica inter-layer insulator 4a including the benzene nucleuses free of substantive residual impurity, particularly residual moisture. Furthermore, the benzene nucleuses with strong bonding in the silica inter-layer insulator 4a are stable among organic polymers to provide the silica inter-layer insulator 4a with a stability at high temperature.

The thickness of the silica inter-layer insulator 4a including the benzene nucleuses is about 1.5 micrometers. Even an aspect ratio of the aperture between the adjacent two of the first level interconnection layers 3 is about 3–4, the silica inter-layer insulator 4a including the benzene nucleuses could be buried into the aperture between the adjacent two of the first level interconnection layers 3 without formation of any voids. It may be considered that the inclusion of the organic polymers, for example, benzene nucleuses in the silica inter-layer insulator allows the silica inter-layer insulator 4a to be buried into the aperture of relatively high aspect ratio. Namely, the silica inter-layer insulator including the benzene nucleuses has a good gap filling property.

The above silica inter-layer insulator 4a has an upper surface which has almost the same difference in level as the thickness of the first level interconnection layers 3.

Figure 5E:
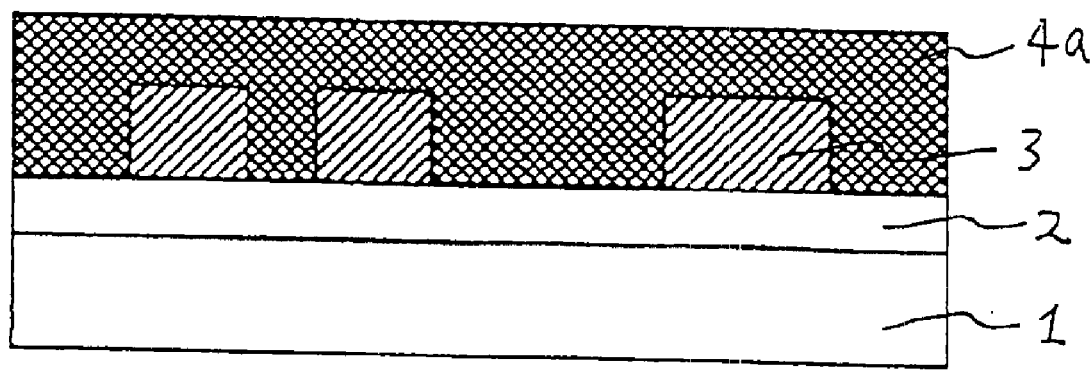

With reference to FIG. 5E, a planarization of the uneven upper surface of the above silica inter-layer insulator 4a is made by use of a chemical mechanical polishing method, wherein alkaline slurry is used. The above silica inter-layer insulator 4a is polished by about 1 micrometers so as to obtain an exactly planarized upper surface of the silica inter-layer insulator 4a.

Figure 5F:
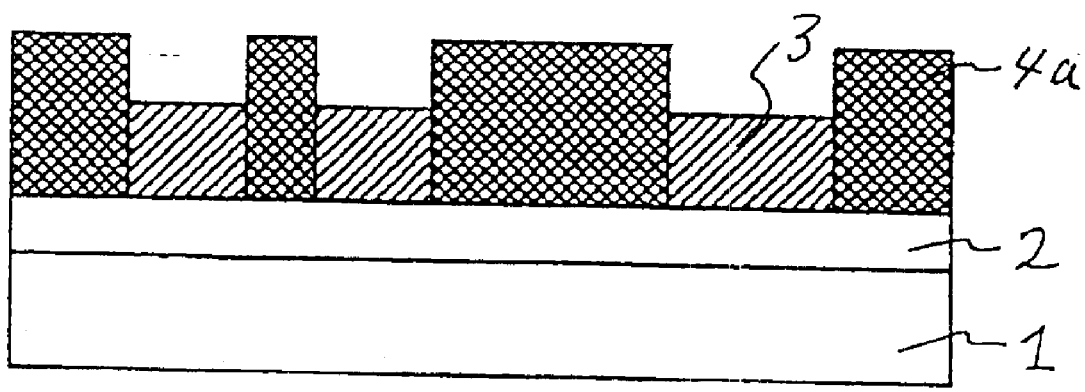

With reference to FIG. 5F, a photo-resist film is entirely applied on the exactly planarized upper surface of the silica inter-layer insulator 4a for subsequent patterning thereof by use of a photo-lithography technique to form a photo-resist pattern. The photo-resist pattern is used as a mask for a dry etching process using $CF_4$ gas in order to form via holes in the above silica inter-layer insulator 4a and over the first level interconnection layers 3.

Figure 5G:
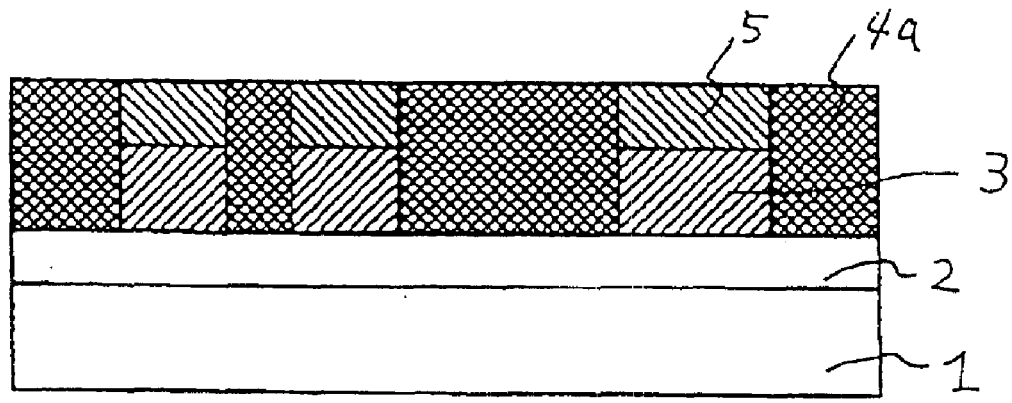

With reference to FIG. 5G, a selective chemical vapor deposition of tungsten layer is carried out to have tungsten via plugs 5 buried within the via holes.

Figure 5H:
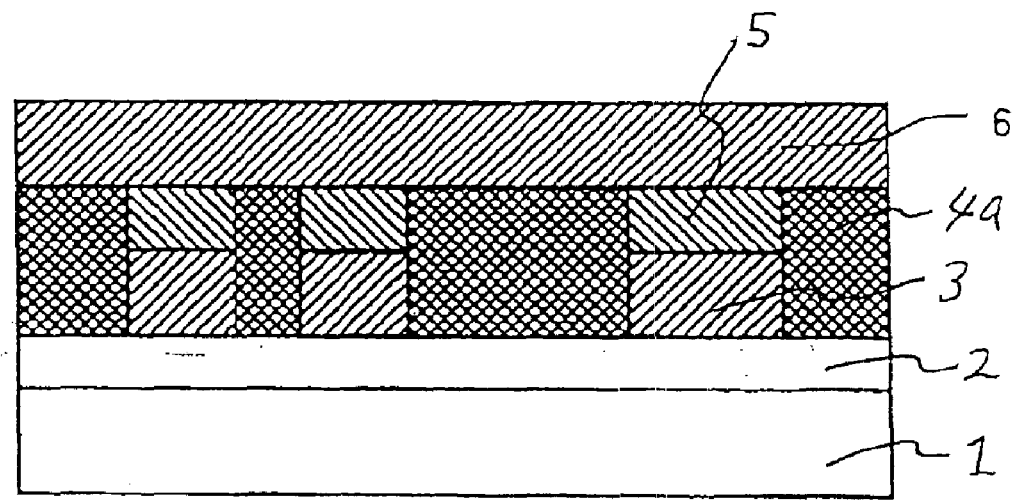

With reference to FIG. 5H, an Al—Si—Cu alloy layer is entirely deposited over the above silica inter-layer insulator 4a and the tungsten via plugs 5 by a sputtering method so that the Al—Si—Cu, alloy layer has a thickness of 0.7 micrometers. The Al—Si—Cu alloy layer is then patterned by a photo-lithography technique to form second level interconnection layers 6 over the above silica inter-layer insulator 4a and the tungsten via plugs 5, wherein the second level interconnection layers 6 are in contact with the tungsten via plugs 5 so that the second level interconnection layers 6 are electrically connected through the tungsten via plugs 5 to the first level interconnection layers 3.

As describe above, the above silica inter-layer insulator 4a including the benzene nucleuses has a good gap filling property which allows the silica inter-layer insulator 4a to be buried into the aperture of relatively high aspect ratio between adjacent two of the first level interconnection layers 3.

Further, the above silica inter-layer insulator 4a including the benzene nucleuses has a good adhesion with both the first and second level interconnection layers 3 and 6.

Furthermore, as described in the eighth and ninth embodiments, the elimination reaction of benzene nucleuses from the silica inter-layer insulator 4a is initiated at about 450° C. This means that the benzene nucleuses included in the silica inter-layer insulator 4a are stable at a temperature of not higher than about 450° C. There is no problem if any heat treatments are carried out at temperatures of not higher than about 450° C. after the silica inter-layer insulator 4a have been formed.

Moreover, if the heat treatment is carried out after the silica inter-layer insulator 4a have been formed, then no reaction is caused between metals in the first or second level interconnection layers 3 or 6 with the benzene nucleuses included in the silica inter-layer insulator 4a.

Since the silica inter-layer insulator 4a including benzene nucleuses has a low dielectric constant, then such the silica inter-layer insulator 4a makes the semiconductor device free from conventional serious problem with substantive delay in signal transmission on the interconnections due to a large parasitic capacitance between the interconnections and with crosstalk of signals on the adjacent two interconnections.

In this embodiment, the plasma chemical vapor deposition was carried out by use of the parallel-plate plasma chemical vapor deposition apparatus. Notwithstanding, any other plasma chemical vapor deposition methods are also available. For example, it was confirmed that, for forming the silica film including the benzene nucleuses by use of phenyltrimethylsilane, there are available an electron cyclotron resonance plasma chemical vapor deposition method, a helicon wave plasma chemical vapor deposition method, and an inductive coupled plasma chemical vapor deposition method.

As a modification to this embodiment, it is also possible to use phenyltrimethoxysilane, instead of phenyltrimethylsilane, as the benzene nucleus source material. In place of the organic polymers having the benzene nucleus with a bonding structure of silicon with benzene nucleus such as phenyltrimethoxysilane and phenyltrimethylsilane it is also possible to use, along with the silicon source gas, other organic polymers having the benzene nucleus free of a bonding structure of silicon with benzene nucleus, such as toluene, benzene, xylene, naphthalene, biphenyl and anthracene.

As a further modification to this embodiment, it is also possible to carry out a low pressure chemical vapor deposition method, instead of the plasma chemical vapor deposition.

Figure 6:
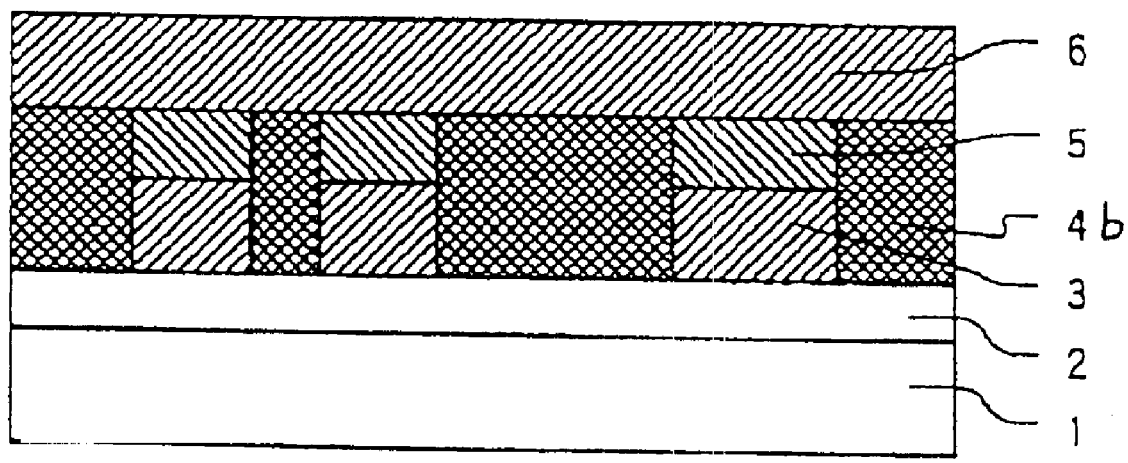
FIG. 6 is a fragmentary cross sectional elevation view illustrative of a semiconductor device with a multi-level interconnection structure which has a porous silica film with a reduced dielectric constant in a tenth embodiment in accordance with the present invention.

Tenth Embodiment:

A tenth embodiment according to the present invention will be described in detail wherein there is provided a semiconductor device with a multi-level interconnection structure which has a silica inter-layer insulator including benzene nucleuses with a reduced dielectric constant formed by a chemical vapor deposition method. FIG. 6 is a fragmentary cross sectional elevation view illustrative of a semiconductor device with a multi-level interconnection structure which has a silica inter-layer insulator with a reduced dielectric constant.

A silicon substrate 1 has an active region. An insulation layer 2 made of phospho-silicate glass is provided which extends over the silicon substrate 1. First level interconnection layers 3 are provided over the insulation layer 2, wherein the first level interconnection layers 3 are electrically connected to the active region of the silicon substrate through contact holes formed in the insulation layer 2. The first level interconnection layers 3 are made of Al—Si—Cu alloy. The first level interconnection layers 3 have a minimum width of 0.25 micrometers and a uniform thickness of 0.7 micrometers. Via plugs 5 made of tungsten are provided on the first level interconnection layers 3. A silica inter-layer insulator 4b is provided over the insulation layer 2 except over the via plugs 5 and the first level interconnection layers 3. The silica inter-layer insulator 4b includes pores having been formed by elimination of benzene nucleuses from the silica inter-layer insulator. The porous silica inter-layer insulator 4b has a lower dielectric constant than a dielectric constant of the silica insulation including the benzene nucleuses. The porous silica inter-layer insulator 4b has a thickness of 0.5 micrometers. Second level interconnection layers 6 are provided over the porous silica inter-layer insulator 4b, wherein the second level interconnection layers 6 are electrically connected to the first level interconnection layers 3 through the via plugs 5. The second level interconnection layers 6 are made of Al—Si—Cu alloy. The second level interconnection layers 6 have a minimum width of 0.25 micrometers and a uniform thickness of 0.7 micrometers.

A method of forming the above semiconductor device with the multi-level interconnection structure which has the silica inter-layer insulator including benzene nucleuses with a reduced dielectric constant will be described with reference to FIGS. 7A through 7H.

Figure 7A:
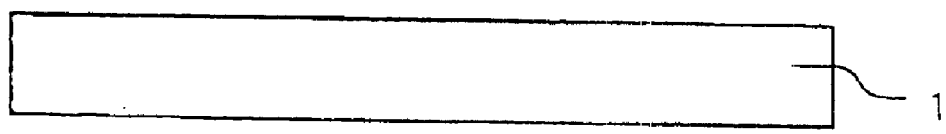
FIGS 7A through 7H are fragmentary cross sectional elevation views illustrative of a method of forming a semiconductor device with a multi-level interconnection structure which has a porous silica film with a reduced dielectric constant in a tenth embodiment in accordance with the present invention.

With reference to FIG. 7A, a silicon substrate 1 is prepared, which has an active region not illustrated.

Figure 7B:
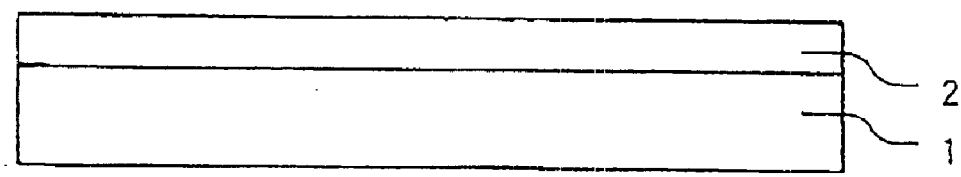

With reference to FIG. 7B, an insulation layer 2 made of phospho-silicate glass is formed over the silicon substrate 1 by the known method. Contact holes not illustrated are formed in the insulation layer 2. Contact metal layers are then formed within the contact holes.

Figure 7C:
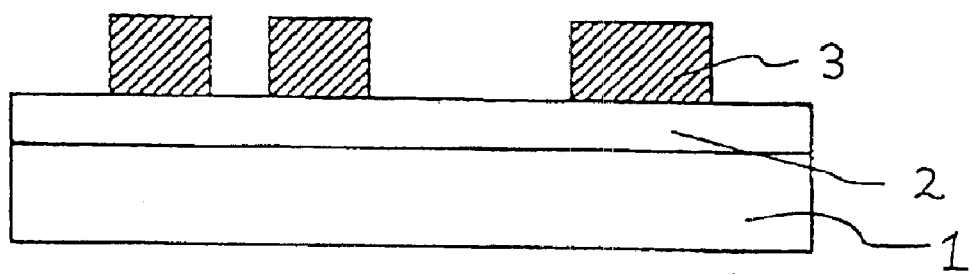

With reference to FIG. 7C, an Al—Si—Cu alloy layer is entirely deposited over the insulation layer 2 by a sputtering method so that the Al—Si—Cu alloy layer has a thickness of 0.7 micrometers. The Al—Si—Cu alloy layer is then patterned by a photo-lithography technique to form first level interconnection layers 3 over the insulation layer 2, wherein the first level interconnection layers 3 are in contact with the contact metal layers so that the first level interconnection layers 3 are electrically connected through the contact metal layers to the silicon substrate 1.

Figure 7D:
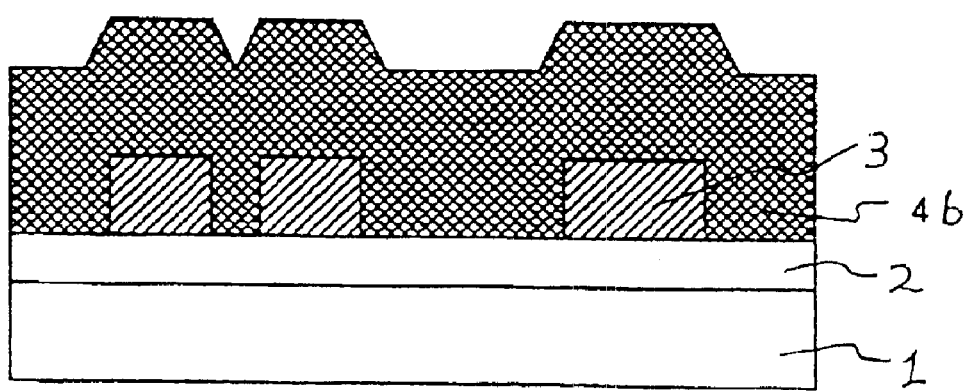

With reference to FIG. 7D, a porous silica inter-layer insulator 4b including pores is entirely deposited over the insulation layer 2 and the first level interconnection layers 3 by the same plasma chemical vapor deposition method as used in the seventh embodiment. The same parallel-plate plasma chemical vapor deposition system as used in the seventh embodiment is also used in this embodiment. Detailed descriptions thereof will be omitted.

In this embodiment, phenyltrimethylsilane and oxygen are used as source gases for formation of a silica insulation film by a plasma chemical vapor deposition method. The individual source gases are subjected to flow rate controls by a mass flow controller not illustrated for subsequent introductions thereof through the source gas introduction system 26 into the reaction chamber 21. Phenyltrimethylsilane has a bonding structure of silicon to benzene nucleus. Phenyltrimethylsilane is reacted with an oxidant to form a silica inter-layer insulator including benzene nucleuses. Phenyltrimethylsilane is in a liquid state at room temperature. Phenyltrimethylsilane has a boiling point of 169° C. Phenyltrimethylsilane in liquid state is first filled in a stainless cylinder for vacuuming the stainless cylinder and subsequent heating the stainless cylinder up to about 100° C. The source gas introduction system 26 including the mass flow controller and the reaction chamber 21 are also heated up to about 150° C. for prevention of condensation of phenyltrimethylsilane so as to allow phenyltrimethylsilane in gas state to be fed through the source gas introduction system 26 into the reaction chamber 21. Oxygen is also fed through the source gas introduction system 26 into the reaction chamber 21.

The parallel-plate plasma chemical vapor deposition is carried out under the following conditions. A flow rate of phenyltrimethylsilane is set at 50 sccm. A flow rate of oxygen is set 100 sccm. A pressure is set 0.1 Torr. A high frequency power of 500 W is applied to the top electrode 22. The substrate temperature is maintained at 300° C.

As a result of the above plasma chemical vapor deposition, the silica inter-layer insulator including the benzene nucleuses is formed over the substrate. Since the conditions for this plasma chemical vapor deposition method are the same as in the first embodiment to obtain the porous silica inter-layer insulator 4b having a carbon content of about 30 at % and a dielectric constant of $\in r=3$, then the silica inter-layer insulator which is formed in this embodiment is also expected to have a carbon content of about 30 at % and a dielectric constant of $\in r=3$.

Following to the above plasma chemical vapor deposition of the silica inter-layer insulator including the benzene nucleuses, the silica inter-layer insulator is then subjected to a heat treatment or an anneal in a vacuum for causing an elimination reaction of benzene nucleuses from the silica inter-layer insulator. The temperature is increased with monitoring components eliminated from the silica inter-layer insulator. It was confirmed that the elimination reaction of benzene nucleuses from the silica inter-layer insulator is initiated at a temperature of about 450° C. In this embodiment, the temperature was increased to and kept at 500° C. so that only benzene nucleuses are selectively eliminated from the silica inter-layer insulator but no elimination of other components than benzene nucleuses from the silica inter-layer insulator could be observed. The selective elimination of the benzene nucleuses from the silica inter-layer insulator results in formation of a porous silica inter-layer insulator 4b. Namely, the porous silica inter-layer insulator 4b includes many pores which have been formed by the elimination of the benzene nucleuses from the silica inter-layer insulator.

A measurement of a dielectric constant of the porous silica inter-layer insulator 4b was made. It was confirmed that the porous silica inter-layer insulator 4b including many pores has a dielectric constant of $\in r=2.5$ which is lower than the silica inter-layer insulator having the benzene nucleuses. This means that the elimination of the benzene nucleuses from the silica inter-layer insulator to form the many pores in the silica inter-layer insulator results in a further reduction in dielectric constant of the silica inter-layer insulator 4b. A density of the porous silica inter-layer insulator 4b is lower than a density of the silica inter-layer insulator including the benzene nucleuses. It may be considered that the reduction in density of the porous silica inter-layer insulator 4b results in drop of the dielectric constant thereof. The elimination of benzene nucleuses from the silica inter-layer insulator to form the porous silica inter-layer insulator 4b results in the reductions in dielectric constant and density of the silica inter-layer insulator. It was confirmed that properties other than density, dielectric constant and refractive index of the porous silica inter-layer insulator 4b substantially remain unchanged by the elimination of benzene nucleuses. It was further confirmed that the properties of the porous silica inter-layer insulator 4b formed by the elimination of the benzene nucleuses also remain unchanged by a heat treatment of at least not higher than 600° C.

The thickness of the porous silica inter-layer insulator 4b is about 1.5 micrometers. Even an aspect ratio of the aperture between the adjacent two of the first level interconnection layers 3 is about 3–4, the porous silica inter-layer insulator 4b could be buried into the aperture between the adjacent two of the first level interconnection layers 3 without formation of any voids. It may be considered that the inclusion of the pores in the silica inter-layer insulator allows the porous silica inter-layer insulator 4b to be buried into the aperture of relatively high aspect ratio. Namely, the porous silica inter-layer insulator has a good gap filling property.

The above porous silica inter-layer insulator 4b has an upper surface which has almost the same difference in level as the thickness of the first level interconnection layers 3.

Figure 7E:
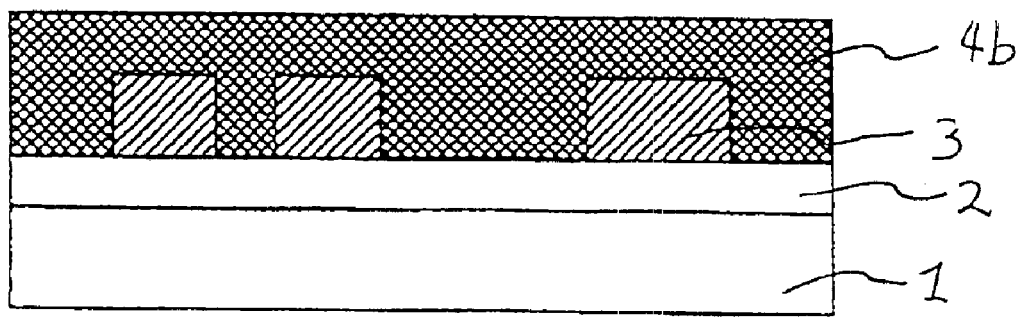

With reference to FIG. 7E, a planarization of the uneven upper surface of the above porous silica inter-layer insulator 4b is made by use of a chemical mechanical polishing method, wherein alkaline slurry is used. The above porous silica inter-layer insulator 4b is polished by about 1 micrometers so as to obtain an exactly planarized upper surface of the porous silica inter-layer insulator 4b.

Figure 7F:
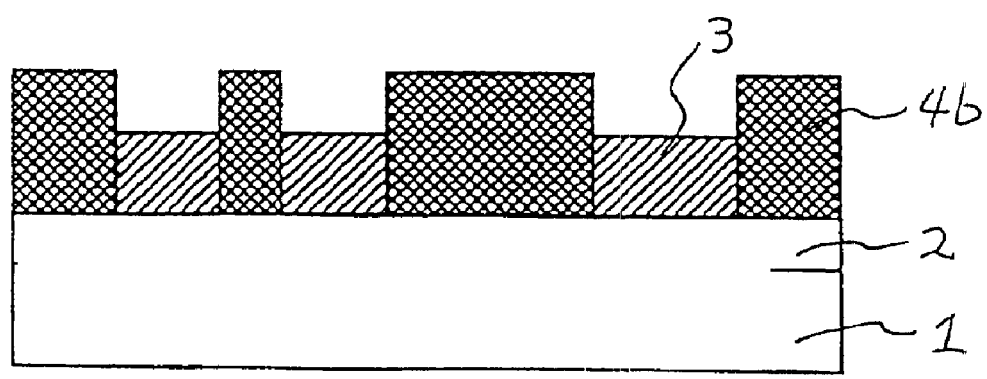

With reference to FIG. 7F, a photo-resist film is entirely applied on the exactly planarized upper surface of the porous silica inter-layer insulator 4b for subsequent patterning thereof by use of a photo-lithography technique to form a photo-resist pattern. The photo-resist pattern is used as a mask for a dry etching process using $CF_4$ gas in order to form via holes in the above silica inter-layer insulator 4b and over the first level interconnection layers 3.

Figure 7G:
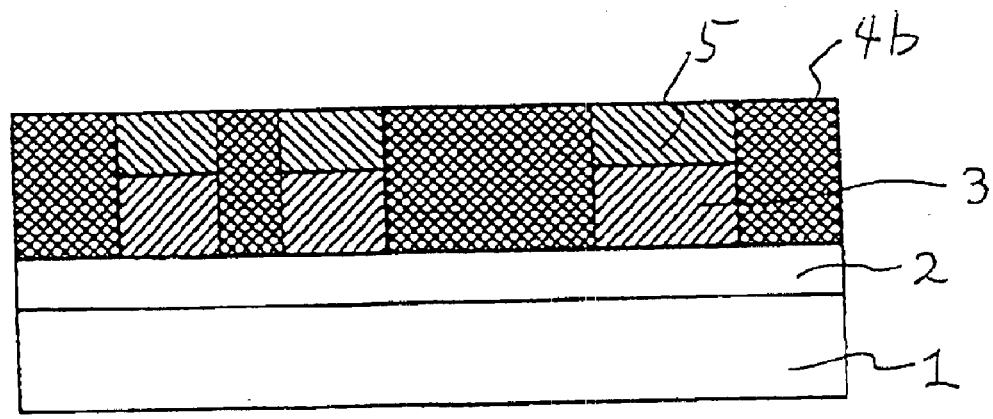

With reference to FIG. 7G, a selective chemical vapor deposition of tungsten layer is carried out to have tungsten via plugs 5 buried within the via holes.

Figure 7H:
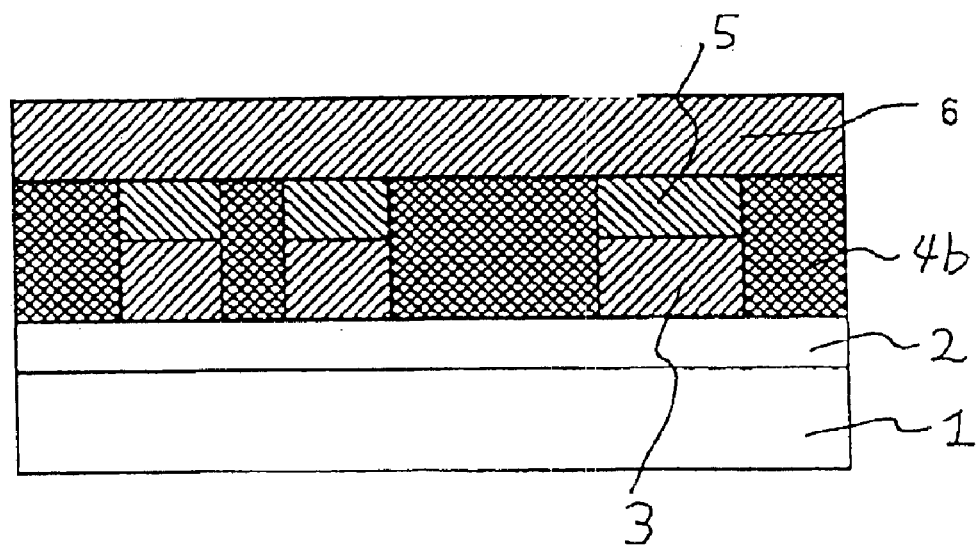

With reference to FIG. 7H, an Al—Si—Cu alloy layer is entirely deposited over the above silica inter-layer insulator 4b and the tungsten via plugs 5 by a sputtering method so that the Al—Si—Cu alloy layer has a thickness of 0.7 micrometers. The Al—Si—Cu alloy layer is then patterned by a photo-lithography technique to form second level interconnection layers 6 over the above porous silica inter-layer insulator 4b and the tungsten via plugs 5, wherein the second level interconnection layers 6 are in contact with the tungsten via plugs 5 so that the second level interconnection layers 6 are electrically connected through the tungsten via plugs 5 to the first level interconnection layers 3.

As describe above, the above porous silica inter-layer insulator 4b has a good gap filling property which allows the silica inter-layer insulator 4b to be buried into the aperture of relatively high aspect ratio between adjacent two of the first level interconnection layers 3.

Further, the above porous silica inter-layer insulator 4b has a good adhesion with both the first and second level interconnection layers 3 and 6.

Since the porous silica inter-layer insulator 4b has a low dielectric constant, then such the porous silica inter-layer insulator 4b makes the semiconductor device free from conventional serious problem with substantive delay in signal transmission on the interconnections due to a large parasitic capacitance between the interconnections and with crosstalk of signals on the adjacent two interconnections.

In this embodiment, the plasma chemical vapor deposition was carried out by use of the parallel-plate plasma chemical vapor deposition apparatus. Notwithstanding, any other plasma chemical vapor deposition methods are also available. For example, it was confirmed that, for forming the silica film including the benzene nucleuses by use of phenyltrimethylsilane, there are available an electron cyclotron resonance plasma chemical vapor deposition method, a helicon wave plasma chemical vapor deposition method, and an inductive coupled plasma chemical vapor deposition method.

As a modification to this embodiment, it is possible to carry out the anneal in an inert gas atmosphere such as an argon atmosphere or a nitrogen atmosphere, instead of the vacuum, for the elimination of the benzene nucleuses.

As a further modification to this embodiment, it is also possible to use phenyltrimethoxysilane, instead of phenyltrimethylsilane, as the benzene nucleus source material. In place of the organic polymers having the benzene nucleus with a bonding structure of silicon with benzene nucleus such as phenyltrimethoxysilane and phenyltrimethylsilane, it is also possible to use, along with the silicon source gas, other organic polymers having the benzene nucleus free of a bonding structure of silicon with benzene nucleus, such as toluene, benzene, xylene, naphthalene, biphenyl and anthracene.

As a furthermore modification to this embodiment, it is also possible to carry out a low pressure chemical vapor deposition method, instead of the plasma chemical vapor deposition.

As moreover modification to this embodiment, it is also possible to remove the benzene nucleuses from the silica film by use of a combustion reaction in an oxygen atmosphere instead of the above elimination reaction.

Eleventh Embodiment

Figure 8:
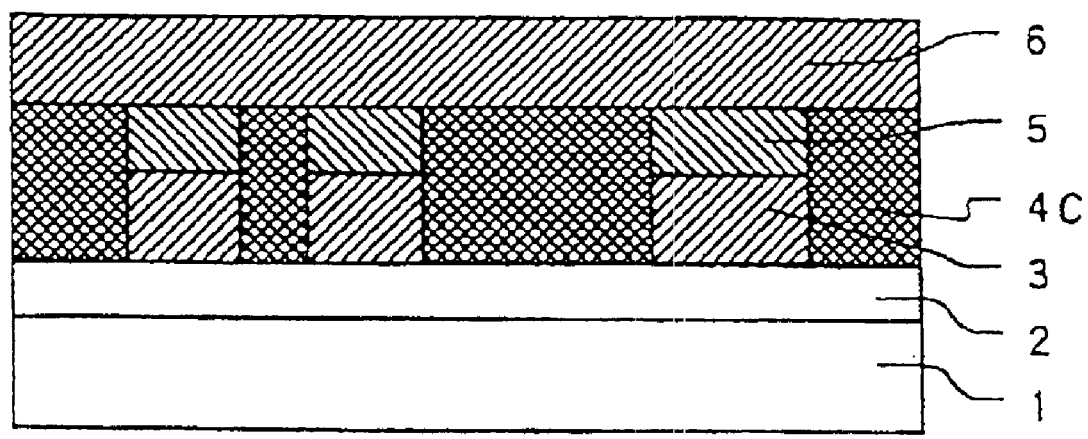
FIG. 8 is a fragmentary cross sectional elevation view illustrative of a semiconductor device with a multi-level interconnection structure which has a porous silica film with a reduced dielectric constant in an eleventh embodiment in accordance with the present invention.

An eleventh embodiment according to the present invention will be described in detail wherein there is provided a semiconductor device with a multi-level interconnection structure which has a silica inter-layer insulator including benzene nucleuses with a reduced dielectric constant formed by a chemical vapor deposition method. FIG. 8 is a fragmentary cross sectional elevation view illustrative of a semiconductor device with a multi-level interconnection structure which has a silica inter-layer insulator with a reduced dielectric constant.

A silicon substrate 1 has an active region. An insulation layer 2 made of phospho-silicate glass is provided which extends over the silicon substrate 1. First level interconnection layers 3 are provided over the insulation layer 2, wherein the first level interconnection layers 3 are electrically connected to the active region of the silicon substrate through contact holes formed in the insulation layer 2. The first level interconnection layers 3 are made of Al—Si—Cu alloy. The first level interconnection layers 3 have a minimum width of 0.25 micrometers and a uniform thickness of 0.7 micrometers. Via plugs 5 made of tungsten are provided on the first level interconnection layers 3. A silica inter-layer insulator 4c is provided over the insulation layer 2 except over the via plugs 5 and the first level interconnection layers 3. The silica inter-layer insulator 4c includes pores having been formed by elimination of benzene nucleuses from the silica inter-layer insulator. The porous silica inter-layer insulator 4c has a lower dielectric constant than a dielectric constant of the silica insulation including the benzene nucleuses. The porous silica inter-layer insulator 4c has a thickness of 0.5 micrometers. Second level interconnection layers 6 are provided over the porous silica inter-layer insulator 4c, wherein the second level interconnection layers 6 are electrically connected to the first level interconnection layers 3 through the via plugs 5. The second level interconnection layers 6 are made of Al—Si—Cu alloy. The second level interconnection layers 6 have a minimum width of 0.25 micrometers and a uniform thickness of 0.7 micrometers.

A method of forming the above semiconductor device with the multi-level interconnection structure which has the silica inter-layer insulator including benzene nucleuses with a reduced dielectric constant will be described with reference to FIGS. 9A through 9H.

Figure 9A:
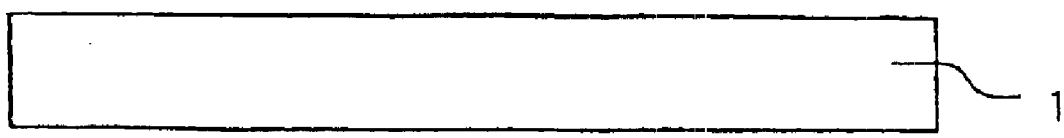
FIGS. 9A through 9H are fragmentary cross sectional elevation views illustrative of another method of forming a semiconductor device with a multi-level interconnection structure which has a porous silica film with a reduced dielectric constant in an eleventh embodiment in accordance with the present invention.

With reference to FIG. 9A, a silicon substrate 1 is prepared, which has an active region not illustrated.

Figure 9B:
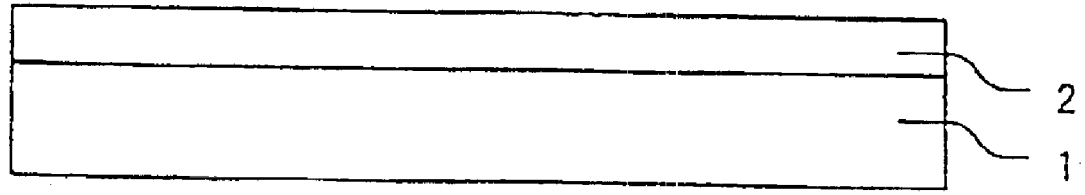

With reference to FIG. 9B, an insulation layer 2 made of phospho-silicate glass is formed over the silicon substrate 1 by the known method. Contact holes not illustrated are formed in the insulation layer 2. Contact metal layers are then formed within the contact holes.

Figure 9C:
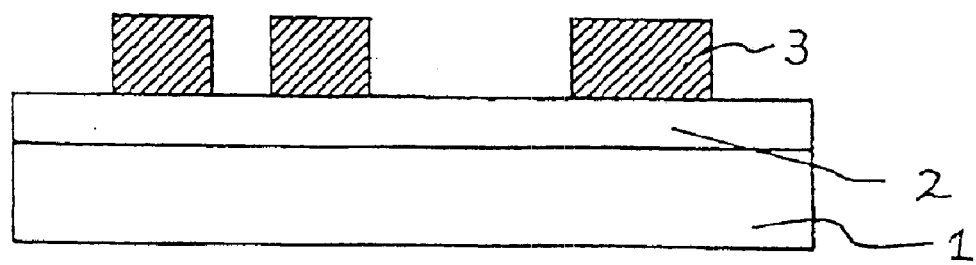

With reference to FIG. 9C, an Al—Si—Cu alloy layer is entirely deposited over the insulation layer 2 by a sputtering method so that the Al—Si—Cu alloy layer has a thickness of 0.7 micrometers. The Al—Si—Cu alloy layer is then patterned by a photo-lithography technique to form first level interconnection layers 3 over the insulation layer 2, wherein the first level interconnection layers 3 are in contact with the contact metal layers so that the first level interconnection layers 3 are electrically connected through the contact metal layers to the silicon substrate 1.

Figure 9D:
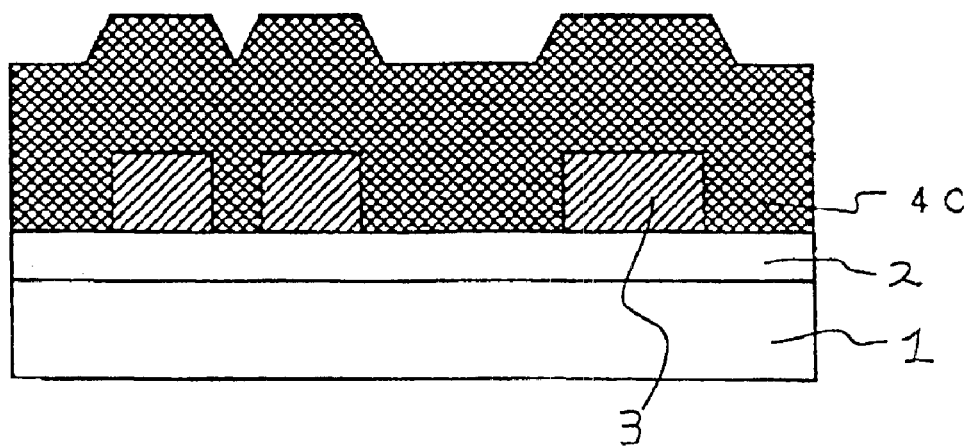

With reference to FIG. 9D, a porous silica inter-layer insulator 4c including pores is entirely deposited over the insulation layer 2 and the first level interconnection layers 3 by the same plasma chemical vapor deposition method as used in the seventh embodiment. The same parallel-plate plasma chemical vapor deposition system as used in the seventh embodiment is also used in this embodiment. Detailed descriptions thereof will be omitted.

In this embodiment, phenyltrimethylsilane and oxygen are used as source gases for formation of a porous silica inter-layer insulator 4c by a plasma chemical vapor deposition method. The individual source gases are subjected to flow rate controls by a mass flow controller not illustrated for subsequent introductions thereof through the source gas introduction system 26 into the reaction chamber 21. Phenyltrimethylsilane has a bonding structure of silicon to benzene nucleus. Phenyltrimethylsilane is reacted with an oxidant to form a porous silica inter-layer insulator 4c including benzene nucleuses, Phenyltrimethylsilane is in a liquid state at room temperature. Phenyltrimethylsilane has a boiling point of 169° C. Phenyltrimethylsilane in liquid state is first filled in a stainless cylinder for vacuuming the stainless cylinder and subsequent heating the stainless cylinder up to about 100° C. The source gas introduction system 26 including the mass flow controller and the reaction chamber 21 are also heated for prevention of condensation of phenyltrimethylsilane so as to allow phenyltrimethylsilane in gas state to be fed through the source gas introduction system 26 into the reaction chamber 21. Oxygen is also fed through the source gas introduction system 26 into the reaction chamber 21.

The parallel-plate plasma chemical vapor deposition is carried out under the following conditions. A flow rate of phenyltrimethylsilane is set at 50 sccm. A flow rate of oxygen is set 100 sccm. A pressure is set 0.1 Torr. A high frequency power of 500 W is applied to the top electrode 22. The substrate temperature is maintained at 500° C. so as to cause the elimination reaction of the benzene nucleuses in the chemical vapor deposition process. As described above in the seventh embodiment, the elimination reaction of the benzene nucleuses from the silica inter-layer insulator is initiated at 450° C. The chemical vapor deposition by keeping the substrate temperature at about 500° C. causes the selective elimination reaction of the benzene nucleuses without any further elimination of other components than benzene nucleuses.

As a result of the above plasma chemical vapor deposition, the porous silica inter-layer insulator 4c is formed over the substrate.

A measurement of a dielectric constant of the porous silica inter-layer insulator 4c was made. It was confirmed that the porous silica inter-layer insulator 4c including many pores has a dielectric constant of $\in r=2.5$ which is lower than the porous silica inter-layer insulators having the benzene nucleuses formed in the foregoing embodiments. This means that the elimination of the benzene nucleuses to form the many pores in the porous silica inter-layer insulator 4b results in a further reduction in dielectric constant of the porous silica inter-layer insulator 4c. A density of the porous silica inter-layer insulator 4c is lower than a density of the silica inter-layer insulator including the benzene nucleuses. It may be considered that the reduction in density of the porous silica inter-layer insulator 4c results in drop of the dielectric constant thereof. The elimination of benzene nucleuses at the same time when the porous silica inter-layer insulator 4c is formed by the chemical vapor deposition results in the reductions in dielectric constant and density of the porous silica inter-layer insulator 4c. It was confirmed that the properties of the porous silica inter-layer insulator 4c formed by the elimination of the benzene nucleuses during the chemical vapor deposition also remain unchanged by a heat treatment of at least not higher than 600° C.

The thickness of the porous silica inter-layer insulator 4c is about 1.5 micrometers. Even an aspect ratio of the aperture between the adjacent two of the first level interconnection layers 3 is about 3–4, the porous silica inter-layer insulator 4c could be buried into the aperture between the adjacent two of the first level interconnection layers 3 without formation of any voids. It may be considered that the inclusion of the pores in the silica inter-layer insulator allows the porous silica inter-layer insulator 4c to be buried into the aperture of relatively high aspect ratio. Namely, the porous silica inter-layer insulator has a good gap filling property.

The above porous silica inter-layer insulator 4c has an upper surface which has almost the same difference in level as the thickness of the first level interconnection layers 3.

Figure 9E:
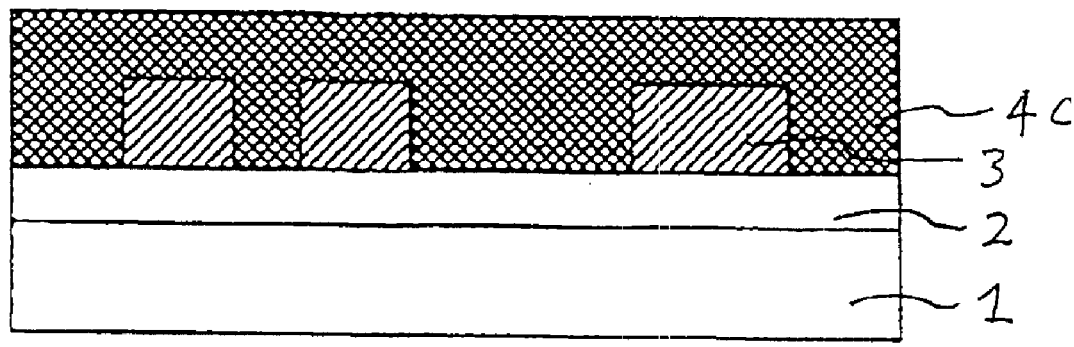

With reference to FIG. 9E, a planarization of the uneven upper surface of the above porous silica inter-layer insulator 4c is made by use of a chemical mechanical polishing method, wherein alkaline slurry is used. The above porous silica inter-layer insulator 4c is polished by about 1 micrometers so as to obtain an exactly planarized upper surface of the porous silica inter-layer insulator 4c.

Figure 9F:
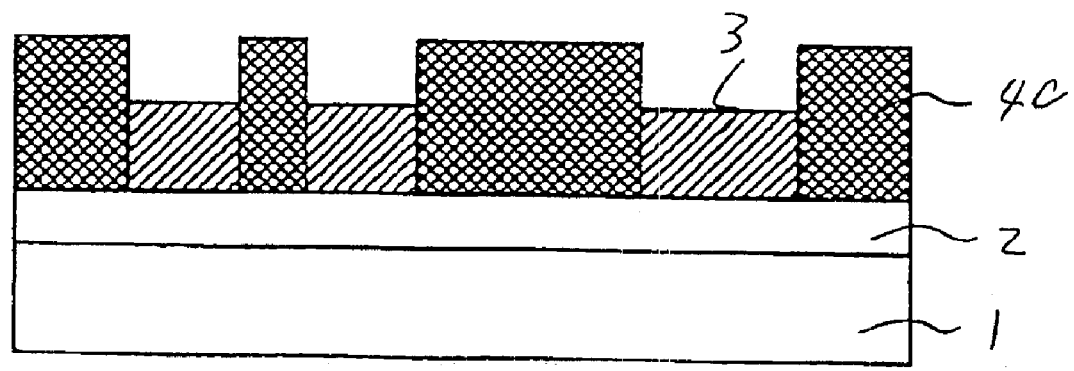

With reference to FIG. 9F, a photo-resist film is entirely applied on the exactly planarized upper surface of the porous silica inter-layer insulator 4c for subsequent patterning thereof by use of a photo-lithography technique to form a photo-resist pattern. The photo-resist pattern is used as a mask for a dry etching process using $CF_4$ gas in order to form via holes in the above silica inter-layer insulator 4c and over the first level interconnection layers 3.

Figure 9G:
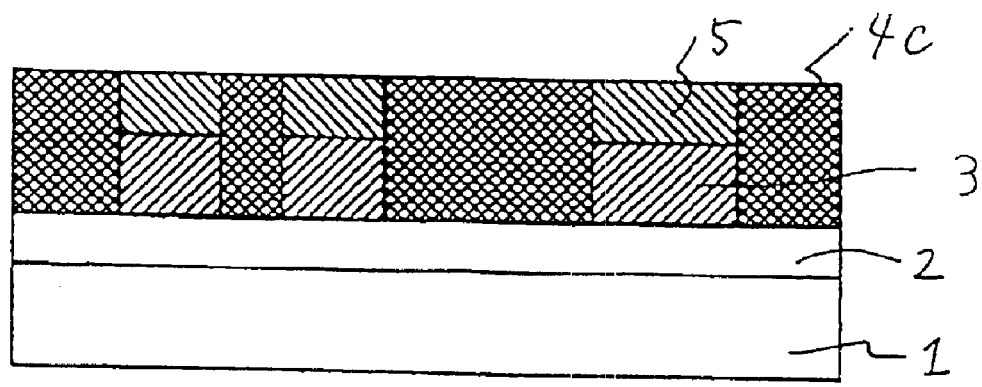

With reference to FIG. 9G, a selective chemical vapor deposition of tungsten layer is carried out to have tungsten via plugs 5 buried within the via holes.

Figure 9H:
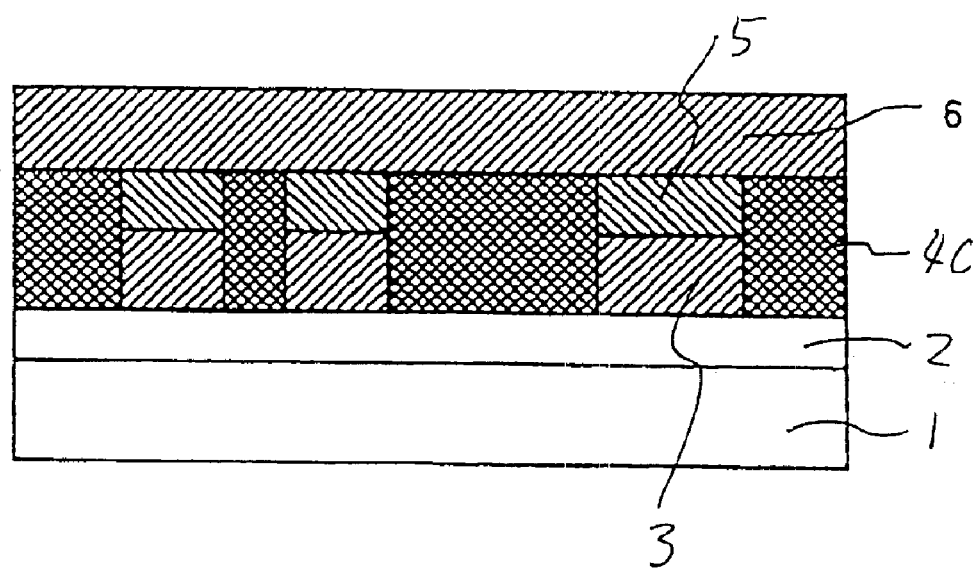

With reference to FIG. 9H, an Al—Si—Cu alloy layer is entirely deposited over the above silica inter-layer insulator 4c and the tungsten via plugs 5 by a sputtering method so that the Al—Si—Cu alloy layer has a thickness of 0.7 micrometers. The Al—Si—Cu alloy layer is then patterned by a photo-lithography technique to form second level interconnection layers 6 over the above porous silica inter-layer insulator 4c and the tungsten via plugs 5, wherein the second level interconnection layers 6 are in contact with the tungsten via plugs 5 so that the second level interconnection layers 6 are electrically connected through the tungsten via plugs 5 to the first level interconnection layers 3.

As describe above, the above porous silica inter-layer insulator 4c has a good gap filling property which allows the silica inter-layer insulator 4c to be buried into the aperture of relatively high aspect ratio between adjacent two of the first level interconnection layers 3.

Further, the above porous silica inter-layer insulator 4c has a good adhesion with both the first and second level interconnection layers 3 and 6.

Since the porous silica inter-layer insulator 4c has a low dielectric constant, then such the porous silica inter-layer insulator 4c makes the semiconductor device free from conventional serious problem with substantive delay in signal transmission on the interconnections due to a large parasitic capacitance between the interconnections and with crosstalk of signals on the adjacent two interconnections.

In this embodiment, the plasma chemical vapor deposition was carried out by use of the parallel-plate plasma chemical vapor deposition apparatus. Notwithstanding, any other plasma chemical vapor deposition methods are also available. For example, it was confirmed that, for forming the silica film including the benzene nucleuses by use of phenyltrimethylsilane, there are available an electron cyclotron resonance plasma chemical vapor deposition method, a helicon wave plasma chemical vapor deposition method, and an inductive coupled plasma chemical vapor deposition method.

As a modification to this embodiment, it is also possible to use phenyltrimethoxysilane, instead of phenyltrimethylsilane, as the benzene nucleus source material. In place of the organic polymers having the benzene nucleus with a bonding structure of silicon with benzene nucleus such as phenyltrimethoxysilane and phenyltrimethylsilane, it is also possible to use, along with the silicon source gas, other organic polymers having the benzene nucleus free of a bonding structure of silicon with benzene nucleus, such as toluene, benzene, xylene, naphthalene, biphenyl and anthracene.

As a further modification to this embodiment, it is also possible to carry out a low pressure chemical vapor deposition method, instead of the plasma chemical vapor deposition.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming an insulator having a main component of silicon dioxide by a chemical vapor deposition method, wherein at least one kind of organic substance including benzene nucleuses is used as a benzene nucleus source so that said insulator includes said benzene nucleuses,
   wherein said chemical vapor deposition method is carried out by maintaining a temperature of not less than about 500° C. so as to cause elimination reaction of said benzene nucleuses at the same time of deposition of said insulator, thereby to form said insulator including pores.

2. The method as claimed in claim 1, wherein said benzene nucleus has a bonding structure with silicon atoms.

3. The method as claimed in claim 2, wherein at least one selected from the group consisting of phenyltrimethylsilane and phenyltrizuetboxysilafle is used as said benzene nucleus source.

4. The method as claimed in claim 2, wherein said organic substance as said benzene nucleus source is used together with a silicon source material.

5. The method as claimed in claim 2, wherein said organic substance as said benzene nucleus source is used alone without any silicon source material.

6. The method as claimed in claim 1, wherein said benzene nucleus is free of a bonding structure with silicon atoms and said organic substance as said benzene nucleus source is used together with a silicon source material.

7. The method as claimed in claim 6, wherein said organic substance has a structure of a single benzene nucleus.

8. The method as claimed in claim 7, wherein said organic substance comprises at least one selected from the group consisting of toluene, benzene and xylene.

9. The method as claimed in claim 6, wherein said organic substance has a structure of a plurality of benzene nucleuses.

10. The method as claimed in claim 9, wherein said organic substance comprises at least one selected from the group consisting of naphthaleno, biphenyl and anthracene.

11. The method as claimed in claim 1, wherein said chemical vapor deposition method is a plasma chemical vapor deposition method.

12. The method as claimed in claim 1, wherein said chemical vapor deposition method is a low pressure chemical vapor deposition method.

13. A method of forming an insulator having a main component of silicon dioxide by a chemical vapor deposition method, wherein at least one kind of organic substance including benzene nucleuses is used as a benzene nucleus source so that said insulator includes said benzene nucleuses,
   wherein after said insulator has been formed by said chemical vapor deposition method, then said benzene nucleuses are removed from said insulator thereby to form pores in said insulator, and
   wherein said benzene nucleuses are removed by causing a combustion reaction in an oxygen atmosphere.

14. A method of forming an insulator having a main component of silicon dioxide by a chemical vapor deposition method, wherein at least one kind of organic substance including benzerie nucleuses is used as a benzene nucleus source so that said insulator includes said benzene nucleuses,
   wherein after said insulator has been formed by said chemical vapor deposition method, then said benzene nucleuses are removed from said insulator thereby to form pores in said insulator,
   wherein said benzene nucleuses are removed by causing an elimination reaction for eliminating benzene nucleuses from said insulator, and
   wherein said elimination reaction is caused by exposure to oxygen radicals generated in a plasma.

15. The method as claimed in claim 14, wherein said elimination reaction is caused by a heat treatment in a vacuum at a temperature of not less than 450° C.

16. The method as claimed in claim 14, wherein said elimination reaction is caused by a heat treatment in an inert gas atmosphere at a temperature of not less than 450° C.

* * * * *